United States Patent
Jang et al.

(10) Patent No.: US 11,730,003 B2
(45) Date of Patent: *Aug. 15, 2023

(54) LIGHT EMITTING DIODE, MANUFACTURING METHOD THEREOF AND DISPLAY DEVICE INCLUDING THE SAME

(71) Applicant: Samsung Display Co., Ltd., Yongin-si (KR)

(72) Inventors: Choelmin Jang, Seoul (KR); Byunghyuk Kwon, Hwaseong-si (KR); Changhee Lee, Seoul (KR); Myungsoo Huh, Suwon-si (KR); Cheollae Roh, Seongnam-si (KR); Jaehoon Kim, Seoul (KR); Jeong Hye Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/560,161

(22) Filed: Dec. 22, 2021

(65) Prior Publication Data

US 2022/0115617 A1     Apr. 14, 2022

Related U.S. Application Data

(63) Continuation of application No. 16/714,389, filed on Dec. 13, 2019, now Pat. No. 11,239,438.

(30) Foreign Application Priority Data

Mar. 26, 2019   (KR) .......................... 10-2019-0034517

(51) Int. Cl.
*H01L 51/50*     (2006.01)
*H10K 30/80*     (2023.01)
(Continued)

(52) U.S. Cl.
CPC .......... *H10K 30/865* (2023.02); *C09K 11/08* (2013.01); *H10K 50/115* (2023.02); *H10K 50/15* (2023.02);
(Continued)

(58) Field of Classification Search
CPC ............ H01L 51/5008; H01L 27/3244; H01L 51/502; H01L 27/322
See application file for complete search history.

(56) References Cited

U.S. PATENT DOCUMENTS 10,103,345 B2    10/2018  Yoon et al.
11,239,438 B2*    2/2022  Jang .................... H01L 51/5092
(Continued)

FOREIGN PATENT DOCUMENTS

CN          102165572 A     8/2011
KR     10-2018-0054262 A    5/2018
(Continued)

OTHER PUBLICATIONS

Dai, Xingliang et al., "Solution-processed, high-performance light-emitting diodes based on quantum dots", *Nature*, vol. 515, Nov. 6, 2014, 15 pages.
(Continued)

*Primary Examiner* — Anthony Ho
(74) *Attorney, Agent, or Firm* — Lewis Roca Rothgerber Christie LLP

(57) ABSTRACT

A light emitting diode according to embodiments of the present disclosure includes a first electrode, a second electrode opposite the first electrode, an emission layer between the first electrode and the second electrode, the emission layer including a quantum dot, a first charge transfer layer between the first electrode and the emission layer, a second charge transfer layer between the second electrode and the emission layer, and an insulating layer in at least one
(Continued)

position between the first charge transfer layer and the emission layer, and/or between the second charge transfer layer and the emission layer, wherein the insulating layer includes an inorganic material. The light emitting diode and a display device including the same show improved life characteristics and emission efficiency properties.

20 Claims, 12 Drawing Sheets

(51) Int. Cl.
| | | |
|---|---|---|
| C09K 11/08 | (2006.01) | |
| H10K 50/15 | (2023.01) | |
| H10K 50/16 | (2023.01) | |
| H10K 50/17 | (2023.01) | |
| H10K 50/86 | (2023.01) | |
| H10K 50/115 | (2023.01) | |
| H10K 59/12 | (2023.01) | |
| H10K 59/38 | (2023.01) | |
| H10K 71/00 | (2023.01) | |
| B82Y 20/00 | (2011.01) | |
| H10K 102/00 | (2023.01) | |

(52) U.S. Cl.
CPC ............ *H10K 50/16* (2023.02); *H10K 50/17* (2023.02); *H10K 50/171* (2023.02); *H10K 50/86* (2023.02); *H10K 50/865* (2023.02); *H10K 59/12* (2023.02); *H10K 59/38* (2023.02); *H10K 71/00* (2023.02); *B82Y 20/00* (2013.01); *H10K 2102/00* (2023.02); *H10K 2102/351* (2023.02)

(56) References Cited

U.S. PATENT DOCUMENTS

| | | |
|---|---|---|
| 2013/0009131 A1 | 1/2013 | Kazlas et al. |
| 2016/0268483 A1 | 9/2016 | Theobald et al. |
| 2017/0117496 A1 | 4/2017 | Koh et al. |
| 2018/0054872 A1 | 2/2018 | Xu et al. |
| 2018/0138434 A1 | 5/2018 | Yoon et al. |
| 2018/0166642 A1 | 6/2018 | Xie |
| 2018/0175254 A1 | 6/2018 | Chung et al. |
| 2018/0215695 A1 | 8/2018 | Chen |
| 2018/0327622 A1 | 11/2018 | Pan et al. |
| 2018/0331313 A1 | 11/2018 | Xu et al. |
| 2019/0131557 A1 | 5/2019 | Lee et al. |

FOREIGN PATENT DOCUMENTS

| | | |
|---|---|---|
| KR | 10-2018-0099997 A | 9/2018 |
| KR | 10-2018-0101302 A | 9/2018 |

OTHER PUBLICATIONS

Extended European Search Report for corresponding European Patent Application No. 20162496.2, dated Jul. 27, 2020, 10 pages.
Haverinen, Hanna M, et al.; Inkjet Printed RGB Quantum Dot-Hybrid LED, Journal of Display Technologies, IEEE Service Center, Display Technology Letters, vol. 6, No. 3, New York, US, Mar. 1, 2010, 3 pages.
Li, Zhiwei; Enhanced performance of quantum dots light-emitting diodes: The case of $Al_2O_3$ electron blocking layer, Vacuum, Pergamon Press, vol. 137, GB, Dec. 14, 2016, 4 pages.
Song, Jizhong, et al.; Organic-Inorganic Hybrid Passivation Enables Perovskite QLEDs with an EQE of 16.48%, Advanced Materials, vol. 30, No. 50, Oct. 10, 2018, 9 pages.

* cited by examiner

LIGHT EMITTING DIODE, MANUFACTURING METHOD THEREOF AND DISPLAY DEVICE INCLUDING THE SAME

CROSS-REFERENCE TO RELATED APPLICATIONS

This application is a continuation of U.S. patent application Ser. No. 16/714,389, filed Dec. 13, 2019, which claims priority to and the benefit of Korean Patent Application No. 10-2019-0034517, filed Mar. 26, 2019, the entire content of both of which is incorporated herein by reference.

BACKGROUND

One or more aspects of embodiments of the present disclosure herein relate to a light emitting diode, a manufacturing method thereof, and a display device including the same, and more particularly, to a light emitting diode having improved luminous efficiency, a manufacturing method thereof, and a display device including the same.

Various display devices used in multimedia devices, such as, for example, televisions, cellular phones, tablet computers, navigations and/or game consoles are being developed. In such display devices, a self-luminescent display device that accomplishes the display of images by illuminating light emitting materials including organic compounds may be used.

In order to improve color reproducibility of display devices, development of a light emitting diode using a quantum dot as a light emitting material is conducted, and the improvement of the reliability and life of a light emitting diode using a quantum dot is required (or desired).

SUMMARY

One or more aspects of embodiments of the present disclosure are directed toward a light emitting diode in which an insulating layer is adjacent to an emission layer which includes a quantum dot, the light emitting diode having improved life and luminous efficiency, and a display device including the same.

One or more aspects of embodiments of the present disclosure also provide a manufacturing method of a light emitting diode, by which an insulating layer with uniform and improved layer quality may be provided by an improved process.

An embodiment of the inventive concept provides a light emitting diode including a first electrode, a second electrode opposite the first electrode, an emission layer between the first electrode and the second electrode, the emission layer including a quantum dot, a first charge transfer layer between the first electrode and the emission layer, a second charge transfer layer disposed between the second electrode and the emission layer, and an insulating layer located (e.g., in a position) between the first charge transfer layer and the emission layer, and/or between the second charge transfer layer and the emission layer. The insulating layer includes an inorganic material.

In one or more embodiments, the insulating layer may include at least one selected from $SiN_x$, $SiO_x$, $Al_2O_3$, $TiO_x$ and $ZrO_x$.

In one or more embodiments, the insulating layer may include an inorganic insulating layer including an inorganic material, and an organic insulating layer including an organic material.

In one or more embodiments, the insulating layer may include a plurality of the inorganic insulating layers including the inorganic insulating layer and a plurality of the organic insulating layers including the organic insulating layer, and the plurality of inorganic insulating layers and the plurality of organic insulating layers may be alternated in the insulating layer.

In one or more embodiments, the organic insulating layer may include at least one selected from n-hexane, furan and hexamethyldisiloxane.

In one or more embodiments, the first charge transfer layer may include a hole injection layer adjacent to the first electrode, and a hole transport layer between the hole injection layer and the emission layer. The second charge transfer layer may include an electron injection layer adjacent to the second electrode, and an electron transport layer between the electron injection layer and the emission layer.

In one or more embodiments, the quantum dot may include a cadmium-based material, and the insulating layer may be between the electron transport layer and the emission layer.

In one or more embodiments, the insulating layer may include a first insulating layer between the first charge transfer layer and the emission layer, and a second insulating layer between the second charge transfer layer and the emission layer.

In one or more embodiments, the first insulating layer and the second insulating layer may have different thicknesses.

In one or more embodiments, the emission layer may include a plurality of quantum dots, and a base part in which the plurality of quantum dots is dispersed. The plurality of quantum dots may form 1 to 10 layers in the emission layer.

In one or more embodiments, the insulating layer may contact the emission layer.

In one or more embodiments, a thickness of the insulating layer may be from about 0.1 nm to about 10 nm.

In one or more embodiments of the inventive concept, a display device includes a plurality of light emitting diodes. Each light emitting diode includes a first electrode, a second electrode opposite the first electrode, an emission layer between the first electrode and the second electrode and including a quantum dot, a first charge transfer layer between the first electrode and the emission layer, a second charge transfer layer between the second electrode and the emission layer, and an insulating layer between the first charge transfer layer and the emission layer, and/or between the second charge transfer layer and the emission layer. The insulating layer includes an inorganic material.

In one or more embodiments, the light emitting diodes may include a first light emitting diode including a first quantum dot to emit a first color light, a second light emitting diode including a second quantum dot to emit a second color light having a longer wavelength than that of the first color light, and a third light emitting diode including a third quantum dot to emit a third color light having a longer wavelength than that of the second color light.

In one or more embodiments, the display device may further include a light control layer on the light emitting diodes.

In one or more embodiments, the insulating layer may include a plurality of inorganic insulating layers, and a plurality of organic insulating layers. The plurality of inorganic insulating layers and the plurality of organic insulating layers may be alternated in the insulating layer.

In one or more embodiments of the inventive concept, a method for manufacturing a light emitting diode includes forming an emission layer including a quantum dot on a first electrode, forming an insulating layer by depositing an inorganic material on the emission layer, and forming a second electrode on the insulating layer.

In one or more embodiments, the forming of the insulating layer may include depositing the inorganic material through atomic layer deposition (ALD).

In one or more embodiments, the forming of the insulating layer may include forming an inorganic insulating layer by depositing the inorganic material, and forming an organic insulating layer by depositing an organic material. The forming of the inorganic insulating layer and the forming of the organic insulating layer are performed alternately and in plural.

In one or more embodiments, the forming of the organic insulating layer may include depositing the organic material through chemical vapor deposition (CVD).

BRIEF DESCRIPTION OF THE FIGURES

The accompanying drawings are included to provide a further understanding of the inventive concept, and are incorporated in and constitute a part of this specification. The drawings illustrate example embodiments of the inventive concept and, together with the description, serve to explain principles of the inventive concept. In the drawings.

DETAILED DESCRIPTION

Figure 1:
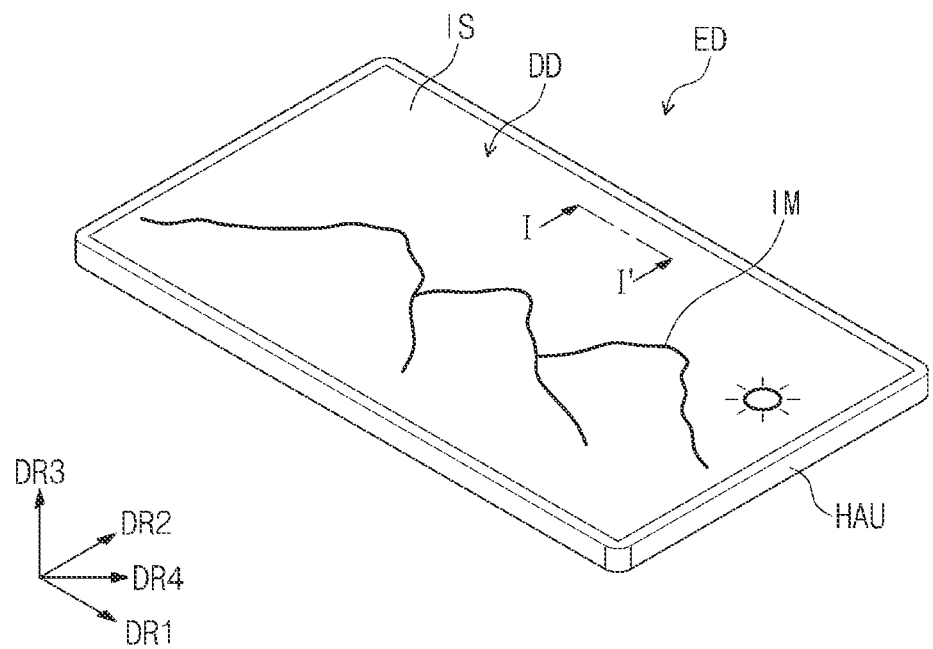
FIG. 1 is a perspective view of an electronic device according to an embodiment of the inventive concept.

Hereinafter, embodiments of the inventive concept will be explained in more detail referring to attached drawings. The inventive concept may be embodied in different forms and may have various modifications, and example embodiments of the inventive concept will be described below in more detail with reference to the accompanying drawings. The inventive concept, however, should not be construed as limited to the embodiments set forth herein. Rather, these embodiments should be understood to include modifications, equivalents, and/or substitutes within the spirit and scope of the inventive concept.

In the drawings, like reference numerals refer to like elements throughout. The dimensions of structures are exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the teachings of the present invention. Similarly, a second element could be termed a first element. As used herein, the singular forms are intended to include the plural forms as well, unless the context clearly indicates otherwise.

It will be further understood that the terms "includes," "including," "comprises," and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

In the present disclosure, when a layer, a film, a region, a plate, etc. is referred to as being "on" or "above" another part, it can be "directly on" the other part, or intervening elements (e.g., layers) may also be present. Similarly, it will be understood that when a layer, a film, a region, a plate, etc. is referred to as being "under" or "beneath" another part, it can be "directly under", and one or more intervening elements (e.g., layers) may also be present. In addition, it will also be understood that when a plate is referred to as being disposed "above" another part, it can be disposed (positioned) above or beneath another part.

Meanwhile, the term "directly contacted" (or e.g., "directly on" or "directly under") in the present disclosure may mean that no additional layer, film, region, plate, etc. is present between a part such as a layer, a film, a region, a plate, etc. and another part. For example, when an element is referred to as "directly contacting" another element, the two elements (e.g., two layers or two units) are disposed next to each other without using an additional unit such as an adhesive unit therebetween.

Hereinafter, the display device and a light emitting diode according to one or more embodiments of the inventive concept will be explained with reference to the accompanying drawings.

Figure 2:
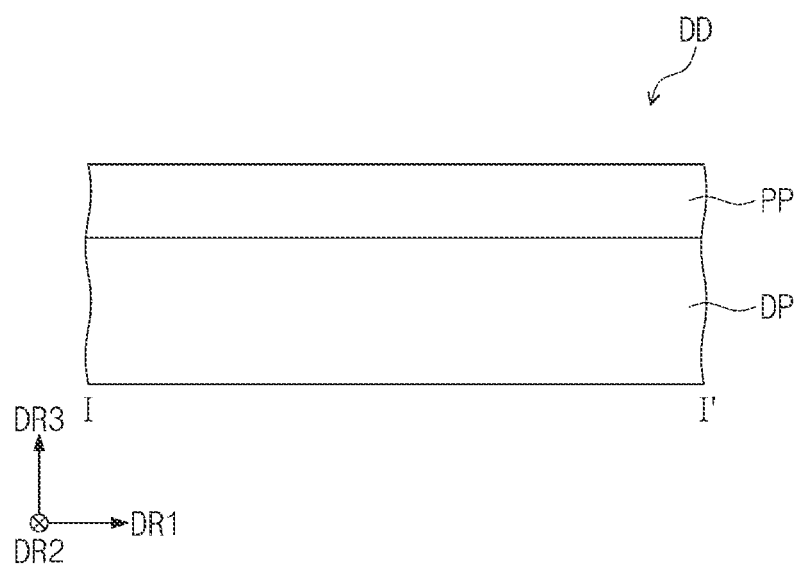
FIG. 2 is a cross-sectional view of a display device according to an embodiment of the inventive concept.
Figure 3A:
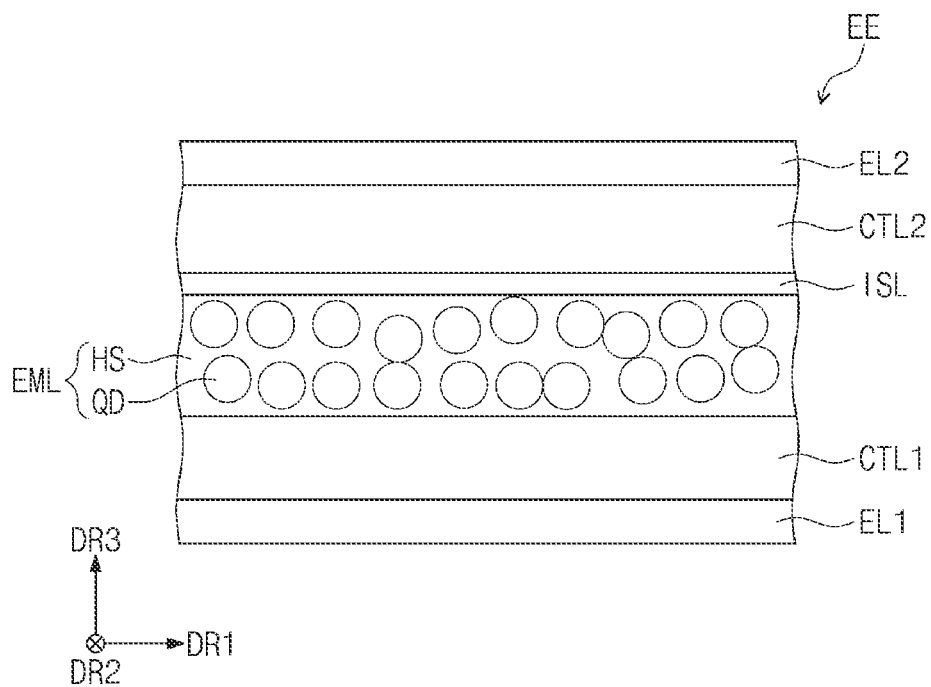
FIG. 3A is a cross-sectional view of a light emitting diode according to an embodiment of the inventive concept.
Figure 3B:
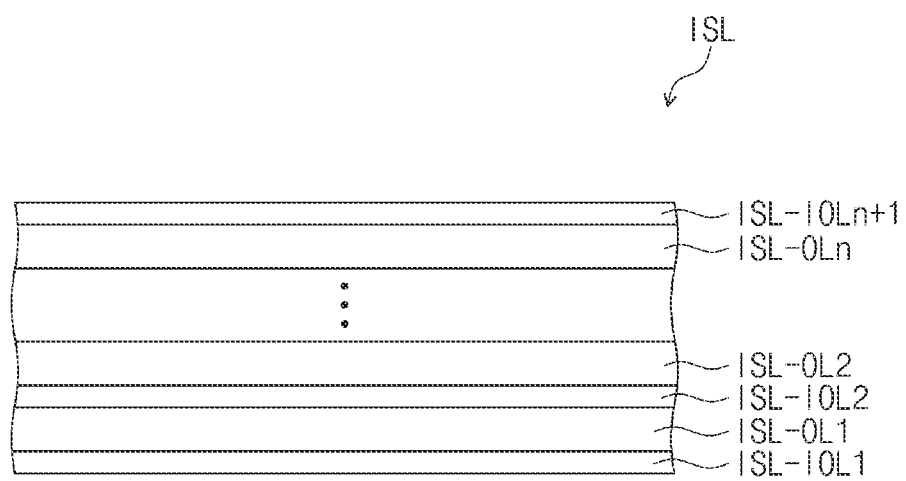
FIG. 3B is a cross-sectional view showing some elements of a light emitting diode according to an embodiment of the inventive concept.

FIG. 1 is a perspective view of an electronic device ED according to an embodiment of the inventive concept. FIG. 2 is a cross-sectional view of a display device DD according to an embodiment of the inventive concept. FIG. 2 is a cross-sectional view corresponding to line I-I' in FIG. 1. FIG. 3A is a cross-sectional view of a light emitting diode EE according to an embodiment of the inventive concept. FIG. 3B is a cross-sectional view showing some elements of a light emitting diode EE according to an embodiment of the inventive concept.

In one or more embodiments, an electronic device ED may be a large-sized electronic device such as a television, a monitor and/or an external advertising board. In addition, the electronic device ED may be a small or a medium-sized electronic device such as a personal computer, a notebook computer, a personal digital terminal, a car navigation unit, a game console, a cellular phone, a tablet and/or a camera. However, these example devices are suggested only for illustration, and other electronic devices may be employed.

The electronic device ED may include a display device DD and a housing HAU. The display device DD may display an image IM through a display surface IS. FIG. 1 shows that the display surface IS is parallel to a surface defined by a first direction DR1 and a second direction DR2 which crosses the first direction DR1. However, this is an illustration, and in other embodiments, the display surface IS of the display device DD may have a bent shape.

The thickness directions of the display device DD (e.g., a direction displaying the image IM) is normal to the display surface IS and is indicated by a third direction DR3. The front surface (or top surface) and rear surface (or bottom surface) of each member may be divided (e.g., spaced from each other) by (along) the third direction DR3.

A fourth direction DR4 may be a direction between the first direction DR1 and the second direction DR2. The fourth direction DR4 vector may lie in a plane that is parallel to the plane defined by the first direction DR1 and the second direction DR2. However, the directions indicated by the first to fourth directions (DR1, DR2, DR3 and DR4) are relative and may be changed to other directions.

The housing HAU may be configured to receive the display device DD. The housing HAU may be disposed to cover the display device DD so that the top surface of the display surface IS of the display device DD is exposed. For example, the housing HAU may cover the side surface and the bottom surface of the display device DD and may expose the entire top surface. However, embodiments of the inventive concept are not limited thereto, and the housing HAU may cover a portion of the top surface as well as the side surface and the bottom surface of the display device DD.

The display device DD may include a display panel DP and a light control layer PP disposed on the display panel DP. The display panel DP includes a light emitting diode EE (see FIG. 11). The display device DD may include a plurality of light emitting diodes EE. The light control layer PP may be disposed on the display panel DP and may control reflected light from the display panel DP by external light. The light control layer PP may include, for example, a polarization layer and/or a color filter layer.

FIG. 3A is a diagram showing a light emitting diode EE according to an embodiment and referring to FIG. 3A, the light emitting diode EE according to an embodiment includes a first electrode EL1, a second electrode EL2 opposite the first electrode EL1, and an emission layer EML disposed between the first electrode EL1 and the second electrode EL2. Between the first electrode EU and the emission layer EML, a first charge transfer layer CTL1 is disposed. Between the second electrode EL2 and the emission layer EML, a second charge transfer layer CTL2 is disposed.

An insulating layer ISL is disposed between the first charge transfer layer CTL1 and the emission layer EML, and/or the second charge transfer layer CTL2 and the emission layer EML. FIG. 3A illustrates an embodiment where the insulating layer ISL is disposed between the second charge transfer layer CTL2 and the emission layer EML, however, the insulating layer ISL may be disposed between the first charge transfer layer CTL1 and the emission layer EML, without limitation. In one or more embodiments, the insulating layer ISL may be disposed between the first charge transfer layer CTL1 and the emission layer EML, and between the second charge transfer layer CTL2 and the emission layer EML, respectively.

The emission layer EML includes a quantum dot QD. The emission layer EML may have a shape in which a plurality of quantum dots QD is dispersed in a base part HS. The core of the quantum dot QD may be selected from a compound of groups II-IV, a compound of groups III-V, a compound of groups IV-VI, an element in group IV, a compound of group IV, and combinations thereof.

The compound of groups II-VI may be selected from a binary compound selected from CdSe, CdTe, ZnS, ZnSe, ZnTe, ZnO, HgS, HgSe, HgTe, MgSe, MgS, and mixtures thereof, a ternary compound selected from AgInS, CuInS, CdSeS, CdSeTe, CdSTe, ZnSeS, ZnSeTe, ZnالسTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof, and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The compound of groups III-V may be selected from a binary compound selected from GaN, GaP, GaAs, GaSb, AlN, AlP, AlAs, AlSb, InN, InP, InAs, InSb, and mixtures thereof, a ternary compound selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and mixtures thereof, and a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

The compound of groups IV-VI may be selected from a binary compound selected from SnS, SnSe, SnTe, PbS, PbSe, PbTe, and mixtures thereof, a ternary compound selected from SnSeS, SnSeTe, SnSTe, PbSeS, PbSeTe, PbSTe, SnPbS, SnPbSe, SnPbTe, and mixtures thereof, and a quaternary compound selected from SnPbSSe, SnPbSeTe, SnPbSTe, and mixtures thereof. The element in group IV may be selected from Si, Ge, and mixtures thereof. The compound of group IV may be a binary compound selected from SiC, SiGe, and mixtures thereof.

In one or more embodiments, the binary compound, the ternary compound and/or the quaternary compound may be present at uniform concentration in a particle, or may be present at a partially different concentration distribution state in the same particle. In addition, a core-shell structure in which one quantum dot encloses another quantum dot may be possible. The interface of the core and the shell may have a concentration gradient in which the concentration of an element present in the shell is decreased toward a center.

In some embodiments, the quantum dot QD may have a core-shell structure including a core including a nanocrystal and a shell enclosing the core. The shell of the quantum dot QD having the core-shell structure may function as a protection layer for preventing or reducing the chemical deformation of the core to maintain semiconductor properties and/or a charging layer for imparting the quantum dot QD with electrophoretic properties. The shell may have a single layer or a multilayer. The interface of the core and the shell may have a concentration gradient in which the concentration of an element present in the shell is decreased toward a center. Examples of the shell of the quantum dot QD having the core-shell structure may include metal, non-metal oxides, semiconductor compounds, and combinations thereof.

For example, the metal and a non-metal oxide may each independently include a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and/or $NiO$, and/or a ternary compound such as $MgAl_2O_4$, $CoFe_2O_4$, $NiFe_2O_4$, and/or $CoMn_2O_4$, but embodiments of the inventive concept are not limited thereto.

In one or more embodiments, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments of the inventive concept are not limited thereto.

The quantum dot QD may have a full width half maximum (FWHM) of emission wavelength spectrum of about 45 nm or less, for example, about 40 nm or less, and in some embodiments, about 30 nm or less. Within this range, color purity and/or color reproducibility may be improved. In addition, light emitted via such quantum dot is emitted in all directions, and a light view angle may be improved.

The shape of the quantum dot QD may be any suitable shape, without specific limitation. For example, the quantum dot QD may have a spherical, pyramidal, multi-arm, and/or cubic nanoparticle, nanotube, nanowire, nanofiber, nanoplate particle shape, etc.

The quantum dot QD may control the color of light being emitted according to the average diameter of a particle, and accordingly, the quantum dot QD may have various emission colors such as blue, red and/or green. With the decrease of the average diameter of the particle of the quantum dot QD, light in a short wavelength region may be emitted. For example, the average diameter of the quantum dot emitting green light may be smaller than the average diameter of the quantum dot emitting red light. In addition, the average diameter of the quantum dot emitting blue light may be smaller than the average diameter of the quantum dot emitting green light.

In the present disclosure, the average diameter may refer to an arithmetic average value of the diameters of a plurality of quantum dot particles. For example, the diameter of the quantum dot particle may be an average value of the width of the quantum dot particle in a cross-section.

In the light emitting diode EE of an embodiment, the emission layer EML may include a host and a dopant. In one or more embodiments, the base part HS of the emission layer EML may include a host material and may include the quantum dot QD as a dopant material.

In the light emitting diode EE of one or more embodiments, the emission layer EML may emit fluorescence. For example, the quantum dot QD may be used as a fluorescence dopant material.

The emission wavelength of light emitted from the emission layer EML may be changed according to the kind (or type) of the quantum dot QD used. The light emitted from the emission layer EML may be blue light, green light or red light according to the kind (or type) of the quantum dot QD.

The emission layer EML may be formed by applying quantum dots QD dispersed in the base part using one or more suitable methods such as a vacuum deposition method, a spin coating method, a cast method, a Langmuir-Blodgett (LB) method, an inkjet printing method, a laser printing method, and/or a laser induced thermal imaging (LITI) method.

The quantum dot QD included in the emission layer EML may be laminated into one or more layers. In one or more embodiments, as shown in FIG. 3A, the quantum dots QD may be laminated into two layers in the emission layer EML. However, embodiments of the inventive concept are not limited thereto, and the quantum dots QD may be laminated into one to ten layers. The quantum dots QD may be laminated into any suitable number of layers, depending on the kind (or type) of the quantum dot QD being used and the desired emission wavelength of light.

In the light emitting diode EE of one or more embodiments, the emission layer EML may further include any suitable anthracene-based light emitting material.

The emission layer EML may further include any suitable host material. For example, in one or more embodiments, the emission layer EML may include, as a host material, tris(8-hydroxyquinolino)aluminum ($Alq_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4'-tris(carbazol-9-yl)-triphenylamine (TCTA), 1,3,5-tris(1-phenyl-1H-benzo[d]imidazol-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)an-thracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane (DP-$SiO_4$), 2,8-bis(diphenylphosphoryl)dibenzofuran (PPF), 3,3'-bis(N-carbazolyl)-1,1'-biphenyl (mCBP), 1,3-bis(N-carbazolyl)benzene (mCP), etc. However, embodiments of the inventive concept are not limited thereto, and one or more suitable host materials may be included in addition to the host materials described above.

In the light emitting diode EE of one or more embodiments, the emission layer EML may further include a dopant. For example, the emission layer EML may include, as the dopant, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), and/or N-(4-((E)-2-(6-((E)-4-(diphenylamino)styryl)naphthalen-2-yl)vinyl)phenyl)-N-phenylbenzenamine (N-BDAVBi), perylene and/or the derivatives thereof (for example, 2,5,8,11-tetra-t-butylperylene (TBP)), pyrene and/or the derivatives thereof (for example, 1,1-dipyrene, 1,4-dipyrenylbenzene, and/or 1,4-bis(N,N-diphenylamino)pyrene), etc.

FIG. 3B is a diagram showing an insulating layer ISL included in the light emitting diode according to one or more embodiments. In one or more embodiments, the insulating layer ISL includes an inorganic material. The insulating layer ISL may include at least one inorganic insulating layer ISL-IOL1 including an inorganic material. The inorganic insulating layer ISL-IOL1 may be formed through atomic layer deposition (ALD).

The inorganic material included in the insulating layer ISL may be at least one selected from $SiN_x$, $SiO_x$, $Al_2O_3$, $TiO_x$, and $ZrO_x$. However, the inorganic material included in the insulating layer ISL may be any suitable material, without limitation, as long as it is a transparent material not blocking light generated from the light emitting diode, and is capable of achieving the charge balance improving effect of a light emitting diode, which will be described later.

The insulating layer ISL may include at least one organic insulating layer ISL-OL1 including an organic material. The organic insulating layer ISL-OL1 may be formed through chemical vapor deposition (CVD).

The organic material included in the organic insulating layer ISL-OL1 may be at least one selected from n-hexane, furan and hexamethyldisiloxane. However, the organic material included in the organic insulating layer ISL-OL1 may be any suitable material, as long as it is a transparent material not blocking light generated from a light emitting diode, and is capable of planarizing the emission layer EML of the light emitting diode to improve barrier properties.

The insulating layer ISL may include a plurality of inorganic insulating layers ISL-IOL1 to ISL-IOLn+1 and a plurality of organic insulating layers ISL-OL1 to ISL-OLn. The plurality of inorganic insulating layers ISL-IOL1 to ISL-IOLn+1 and the plurality of organic insulating layers ISL-OL1 to ISL-OLn may be alternately disposed. In FIG. 3B, a case where the inorganic insulating layers ISL-IOL1 and ISL-IOLn+1 are respectively disposed at the lowermost layer and at the uppermost layer of the insulating layer ISL is shown as an embodiment, but embodiments of the inventive concept are not limited thereto. For example, the organic insulating layer may be disposed as at least one of the lowermost layer or the uppermost layer of the insulating layer ISL.

In the light emitting diode according to one or more embodiments of the inventive concept, the insulating layer may be disposed between the emission layer and a charge transfer layer, and the charge balance of the light emitting diode may be improved and light emission properties of the light emitting diode may be improved.

More particularly, in the light emitting diode including the quantum dot as the light emitting material, an energy level for hole injection and an energy level for electron injection to the emission layer may be different. In this case, the imbalance between the amounts of the holes and electrons injected to the emission layer may arise, and the life and emission efficiency of a device may decrease. According to the inventive concept, an insulating layer may be disposed between an emission layer and a charge transfer layer so that one side of holes or electrons is not excessively injected (considering the difference between the hole injection energy level and the electron injection energy level) to the emission layer which includes the quantum dot as a light emitting material. Accordingly, the amounts of holes and electrons injected to the emission layer may be controlled in balance, and as a result, the emission properties of the light emitting diode may be improved.

Particularly, by forming an insulating layer by depositing an inorganic material through an atomic layer deposition (ALD) method according to one or more embodiments of the inventive concept, the insulating layer may be formed uniformly to have a smaller thickness when compared with coating an organic material. In addition, in an emission layer in which quantum dots are disposed into a plurality of layers, though the quantum dots are laminated nonuniformly in a partial region, the top portion of the emission layer is covered with the inorganic insulating layer and the charge transfer may be achieved more uniformly. Accordingly, the stability of a device may be improved.

For example, in the light emitting diode of the inventive concept, an insulating layer formed using alternately disposed inorganic insulating layers and organic insulating layers may be included. In this case, through (e.g., by including) the inorganic insulating layer uniformly formed to have a relatively small thickness, the charge balance of holes and electrons injected into the emission layer may be suitably controlled due to an inorganic layer having excellent (or suitable) layer quality, and through (e.g., by including) the organic insulating layer which is capable of planarizing the top portion of the emission layer, the charge balance controlling properties of the insulating layer may be improved.

The insulating layer ISL may have a thickness of about 0.1 nm to about 10 nm. If the insulating layer ISL is less than about 0.1 nm thick, the improvement of the charge balance control of the emission layer may be difficult to achieve, and if the insulating layer ISL is greater than about 10 nm thick, charge injection properties from the charge transfer layer to the emission layer may be deteriorated.

FIG. 4 to FIG. 9 are cross-sectional views of light emitting diodes EE-1, EE-2, EE-3, EE-4, EE-5 and EE-6 according to embodiments of the inventive concept. Hereinafter, various embodiments of the light emitting diode of the inventive concept will be explained referring to FIGS. 4 to 9. The same reference symbols will be designated for the same constituent elements as explained in connection with FIG. 3A and FIG. 3B, and duplicative explanations will not be provided.

Figure 4:
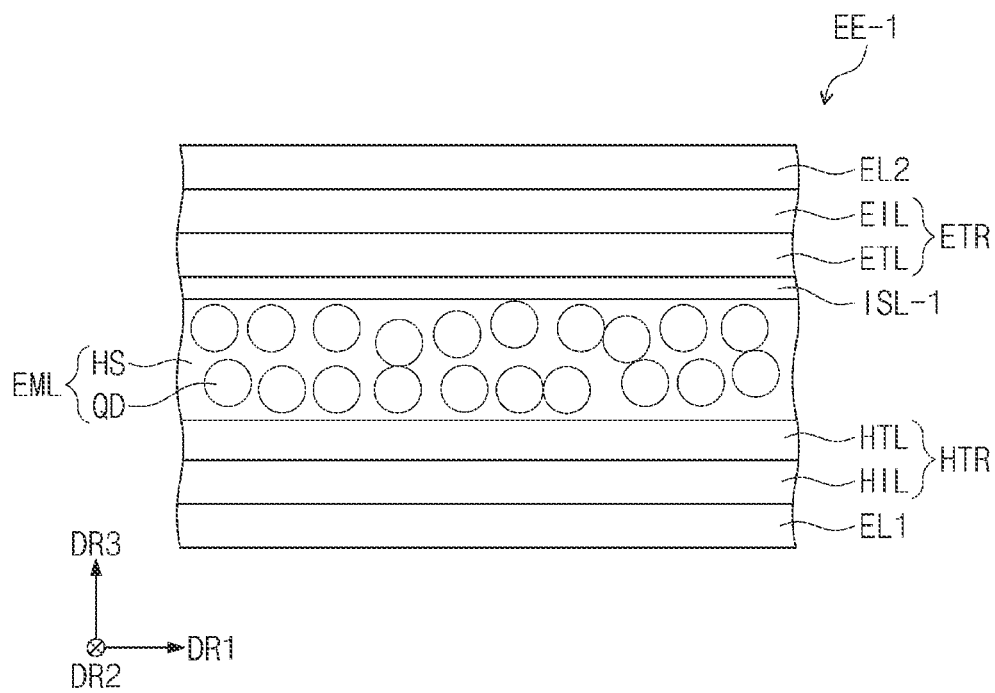
FIGS. 4-9 are cross-sectional views of light emitting diodes according to embodiments of the inventive concept.

Referring to FIG. 4, a light emitting diode EE-1 according to an embodiment includes a first electrode EL1, a second electrode EL2 opposite the first electrode EL1, and an emission layer EML disposed between the first electrode EL1 and the second electrode EL2, and the emission layer EML may include a hole transport region HTR disposed between the first electrode EL1 and the emission layer EML, and an electron transport region ETR disposed between the emission layer EML and the second electrode EL2. Between the emission layer EML and the electron transport region ETR, an insulating layer ISL-1 may be disposed. The insulating layer ISL-1 may be disposed so as to make contact with the emission layer EML. The light emitting diode EE-1 may be a top emission light emitting diode.

The hole transport region HTR and the electron transport region ETR may include a plurality of sub organic layers, respectively. For example, the hole transport region HTR may include a hole injection layer HIL and a hole transport layer HTL as sub organic layers, and the electron transport region ETR may include an electron injection layer EIL and an electron transport layer ETL as sub organic layers. However, embodiments of the inventive concept are not limited thereto, and the hole transport region HTR may further include an electron blocking layer as a sub organic layer, and the electron transport region ETR may further include a hole blocking layer as a sub organic layer.

In the light emitting diode EE-1 according to an embodiment, the first electrode EL1 has conductivity. The first electrode EL1 may be formed using a metal alloy and/or a conductive compound. The first electrode EL1 may be an anode. The first electrode EL1 may be a pixel electrode.

In the light emitting diode EE-1 according to an embodiment, the first electrode EL1 may be a reflective electrode. However, embodiments of the inventive concept are not limited thereto. For example, the first electrode EL1 may be a transmissive electrode or a transflective electrode. If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In one or more embodiments, the first electrode EL1 may have a multilayered structure including a reflective layer and/or a transflective layer formed using any of the above-described materials, and a transparent conductive layer formed using indium tin oxide (ITO), indium zinc oxide (IZO), zinc oxide (ZnO), indium tin zinc oxide (ITZO), and/or the like. For example, the first electrode EL1 may be a multilayered metal layer, and may have a laminated structure of ITO/Ag/ITO.

The hole transport region HTR may be disposed on the first electrode EL1. The hole transport region HTR may include a hole injection layer HIL and a hole transport layer HTL. In one or more embodiments, the hole transport region HTR may further include at least one selected from a hole buffer layer and an electron blocking layer, in addition to the hole injection layer HIL and the hole transport layer HTL. The hole buffer layer may compensate an optical resonance distance according to the wavelength of light emitted from the emission layer EML and may increase light emission efficiency. Any of the materials which may be included in the hole transport region HTR may be used as materials which may be included in the hole buffer layer. The electron blocking layer may block or reduce the electron injection from the electron transport region ETR to the hole transport region HTR.

The hole transport region HTR may have a single layer formed using a single material, a single layer formed using a plurality of different materials, or a multilayer structure including a plurality of layers formed using a plurality of different materials. For example, the hole transport region HTR may have a structure of a single layer formed using a plurality of different materials or a structure laminated from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer, without limitation.

The hole transport region HTR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

The hole injection layer HIL may include, for example, a phthalocyanine compound (such as copper phthalocyanine); N,N'-diphenyl-N,N'-bis-[4-(phenyl-m-tolyl-amino)-phenyl]-biphenyl-4,4'-diamine (DNTPD), 4,4',4'-tris(3-methylphenylphenylamino)triphenylamine (m-MTDATA), 4,4',4'-tris(N,N-diphenylamino)triphenylamine (TDATA), 4,4',4'-tris{N,-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, and/or dipyrazino[2,3-f: 2',3'-h]quinoxaline-2,3,6,7,10,11-hexacarbonitrile (HAT-CN).

The hole transport layer HTL may include carbazole derivatives (such as N-phenyl carbazole and/or polyvinyl carbazole), fluorine derivatives, N,N'-bis(3-methylphenyl)-N,N'-diphenyl-[1,1-biphenyl]-4,4'-diamine (TPD), triphenylamine derivatives (such as 4,4',4''-tris(N-carbazolyl) triphenylamine (TCTA)), N,N'-di(naphtalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis (N-carbazolyl)benzene (mCP), etc.

In the light emitting diode EE-1 of an embodiment, the electron transport region ETR may be disposed on the emission layer EML. The electron transport region ETR may include at least one selected from a hole blocking layer, an electron transport layer ETL, and an electron injection layer EIL. However, embodiments of the inventive concept are not limited thereto.

The electron transport region ETR may have a single layer formed using a single material, a single layer formed using a plurality of different materials, or a multilayer structure having a plurality of layers formed using a plurality of different materials.

For example, the electron transport region ETR may have the structure of a single layer (such as an electron injection layer EIL or an electron transport layer ETL), and may have a structure of a single layer formed using an electron injection material and an electron transport material. In one or more embodiments, the electron transport region ETR may have a single layer structure having a plurality of different materials, or a structure laminated from the emission layer EML of electron transport layer ETL/electron injection layer EIL, or hole blocking layer/electron transport layer ETL/electron injection layer EIL, without limitation. The thickness of the electron transport region ETR may be, for example, from about 1,000 Å to about 1,500 Å.

The electron transport region ETR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

If the electron transport region ETR includes the electron transport layer ETL, the electron transport region ETR may include an anthracene-based compound. However embodiments of the inventive concept are not limited thereto, and the electron transport region may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tris(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq2), 9,10-di(naphthalene-2-yl) anthracene (ADN), or a mixture thereof. The thickness of the electron transport layer ETL may be from about 100 Å to about 1,000 Å and may be, for example, from about 150 Å to about 500 Å. If the thickness of the electron transport layer ETL satisfies the above-described range, satisfactory (or suitable) electron transport properties may be obtained without substantial increase of a driving voltage.

If the electron transport region ETR includes the electron injection layer EIL, the electron transport region ETR may include LiF, lithium quinolate (LiQ), $Li_2O$, BaO, NaCl, CsF, a metal in the lanthanoides series (such as Yb), and/or a metal halide (such as RbCl and/or RbI). However, embodiments of the inventive concept are not limited thereto. The electron injection layer EIL may also be formed using a mixture material of an electron transport material and an insulating organo metal salt. For example, the organo metal salt may include metal acetates, metal benzoates, metal acetoacetates, metal acetylacetonates, and/or metal stearates. The thickness of the electron injection layer EIL may be from about 1 Å to about 100 Å, for example, from about 3 Å to about 90 Å. If the thickness of the electron injection layer EIL satisfies the above described range, satisfactory (or suitable) electron injection properties may be obtained without inducing substantial increase of a driving voltage.

The electron transport region ETR may include a hole blocking layer as described above. The hole blocking layer may include, for example, at least one selected from 2,9-dimethyl-4,7-diphenyl-1,10-phenanthroline (BCP) and 4,7-diphenyl-1,10-phenanthroline (Bphen). However, embodiments of the inventive concept are not limited thereto.

The second electrode EL2 is disposed on the electron transport region ETR. The second electrode EL2 may be a common electrode or a cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In one or more embodiments, the second electrode EL2 may have a multilayered structure including a reflective layer or a transflective layer formed using any of the above-described materials, and a transparent conductive layer formed using any of ITO, IZO, ZnO, ITZO, etc.

The second electrode EL2 may be connected with an auxiliary electrode. If the second electrode EL2 is connected with the auxiliary electrode, the resistance of the second electrode EL2 may be decreased.

In one or more embodiments, the quantum dot included in the light emitting diode EE-1 may include a cadmium-based material. The light emitting diode EE-1 may include any one compound selected from CdSe, CdTe, CdSeS, CdSeTe, CdSTe, CdZnS, CdZnSe, CdZnTe, CdHgS, CdHgSe, CdHgTe, CdZnSeS, CdZnSeTe, CdZnSTe, CdHgSeS, CdHgSeTe, and CdHgSTe, as a light emitting material. In this case, the emission layer EML of the light emitting diode EE-1 may have electron injection properties higher than hole injection properties. Accordingly, in the light emitting diode EE-1 according to an embodiment of the inventive concept, an insulating layer ISL may be included between the electron transport region ETR and the emission layer EML, and excessive injection of electrons from the electron transport region ETR to the emission layer EML may be prevented or reduced. Accordingly, the amounts of holes and electrons injected into the emission layer which includes the cadmium-based quantum dot as a light emitting material may balance out, and as a result, the light emission properties of the light emitting diode EE-1 may be improved.

Figure 5:
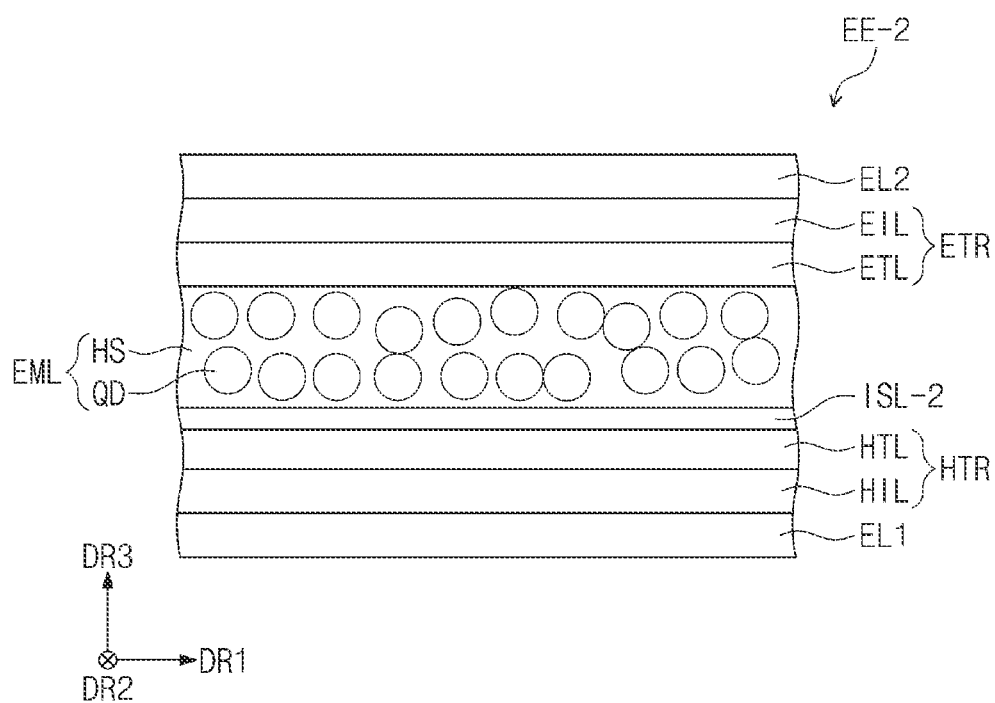

Referring to FIG. 5, in a light emitting diode EE-2 according to an embodiment, an insulating layer ISL-2 may be disposed between a hole transport region HTR and an emission layer EML. The insulating layer ISL-2 may be disposed to make contact with the emission layer EML. The excessive injection of holes from a hole transport layer HTL to an emission layer EML may be prevented or reduced through the disposition of the insulating layer ISL-2 between the hole transport layer HTL and the emission layer EML. More particularly, according to the kind of the quantum dot QD included in the emission layer EML, hole injection properties may be higher than electron injection properties, but the amount of holes and the amount of electrons injected are controlled to make balance (e.g., balance out) due to the insulating layer ISL-2 which is disposed between the hole transport layer HTL and the emission layer EML, and the light emission properties of the light emitting diode EE-2 may be improved.

Figure 6:
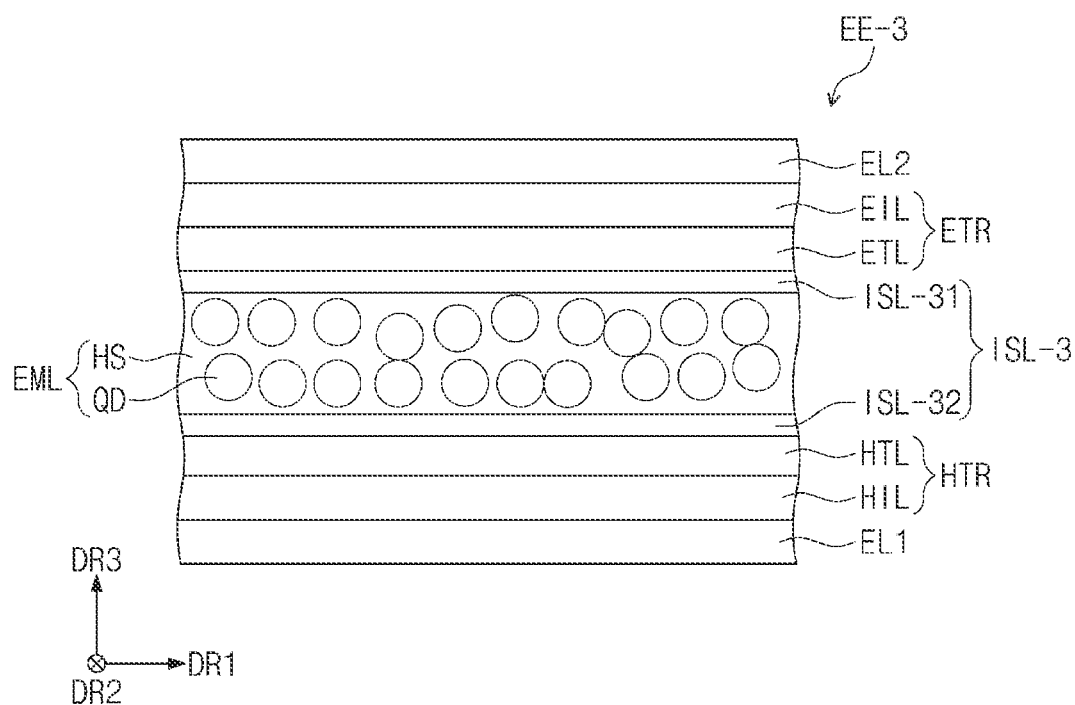

Referring to FIG. 6, in a light emitting diode EE-3 according to an embodiment, an insulating layer ISL-3 may include a plurality of layers. For example, the insulating layer ISL-3 may include a first insulating layer ISL-31 and a second insulating layer ISL-32. The first insulating layer ISL-31 may be disposed between an emission layer EML and an electron transport region ETR, and the second insulating layer ISL-32 may be disposed between the emission layer EML and a hole transport region HTR. The first insulating layer ISL-31 and the second insulating layer ISL-32 each may be disposed to make contact with the emission layer EML.

The first insulating layer ISL-31 and the second insulating layer ISL-32 may each independently include an inorganic material and an organic material. The first insulating layer ISL-31 and the second insulating layer ISL-32 may each independently include an inorganic insulating layer including the inorganic material, and an organic insulating layer including the organic material, and a plurality of inorganic insulating layers and a plurality of organic insulating layers may be alternately disposed in the respective one of the first insulating layer ISL-31 and the second insulating layer ISL-32.

The first insulating layer ISL-31 and the second insulating layer ISL-32 may each independently have a thickness of about 0.1 nm to about 10 nm.

The first insulating layer ISL-31 and the second insulating layer ISL-32 may include the same or different materials. The first insulating layer ISL-31 and the second insulating layer ISL-32 may have the same or different thicknesses. The material included and the thickness of each of the first insulating layer ISL-31 and the second insulating layer ISL-32 may be appropriately (or suitably) selected according to the kind of the quantum dot QD included in the emission layer EML so as to achieve suitable balance of hole injection properties and electron injection properties. For example, if the quantum dot QD included in the emission layer EML has hole injection properties higher than electron injection properties, the thickness of the second insulating layer ISL-32 may be greater than the thickness of the first insulating layer ISL-31.

Figure 7:
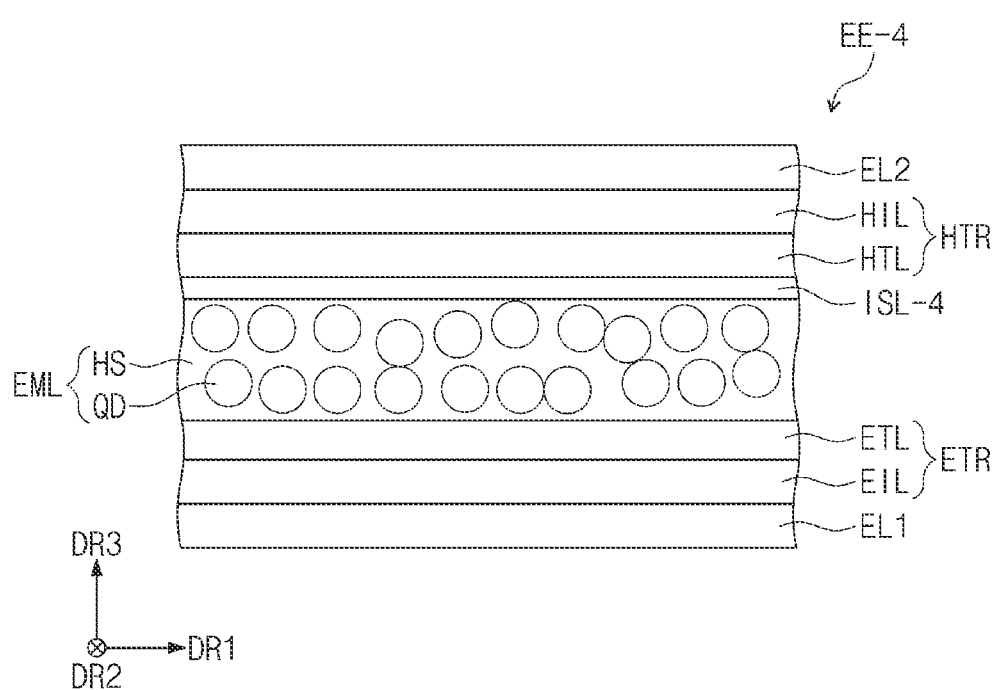

Referring to FIG. 7, a light emitting diode EE-4 according to an embodiment may include a first electrode EL1, a second electrode EL2 opposite the first electrode EL1, and an emission layer EML disposed between the first electrode EL1 and the second electrode EL2, and may include an electron transport region ETR disposed between the first electrode EL1 and the emission layer EML, and a hole transport region HTR disposed between the emission layer EML and the second electrode EL2. Between the emission layer EML and the hole transport region HTR, an insulating layer ISL-4 may be disposed. The insulating layer ISL-4 may be disposed to make contact with the emission layer EML. The light emitting diode EE-4 may be a bottom emission light emitting diode. That is, the light emitting diode EE-4 may be a device emitting light in a direction from the second electrode EL2 to the first electrode EL1.

The light emitting diode EE-4 according to an embodiment may have hole injection properties higher than electron injection properties according to the kind of the quantum dot QD included in the emission layer EML, but the amount of holes and the amount of electrons injected are controlled to make (achieve) balance due to the insulating layer ISL-4 disposed between the hole transport layer HTL and the emission layer EML, and thus the light emitting properties of the light emitting diode EE-4 may be improved.

Figure 8:
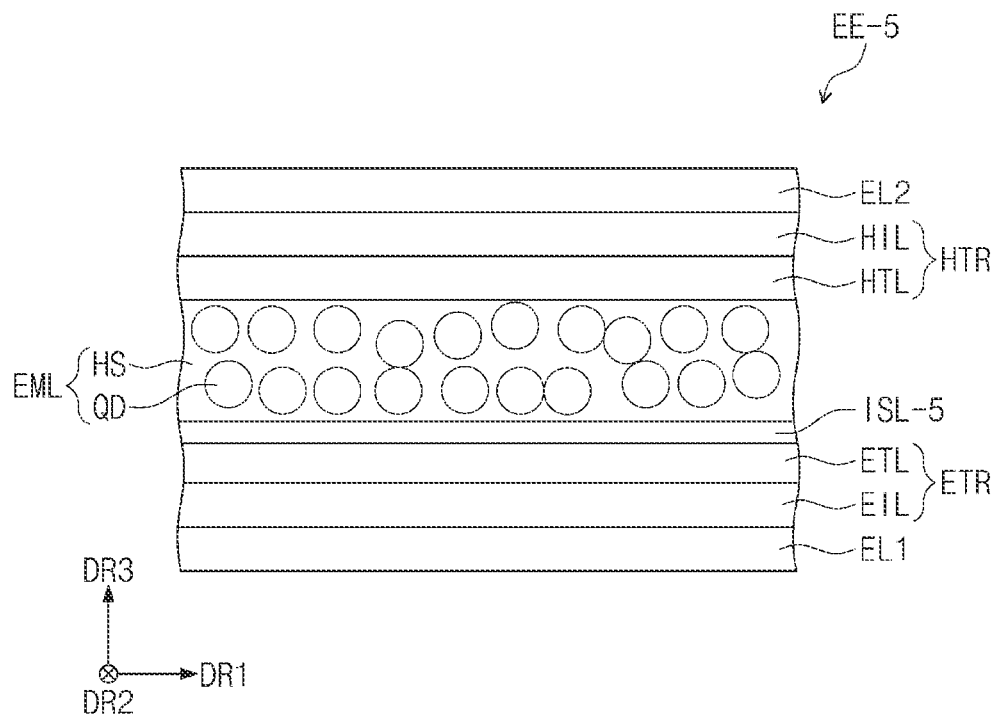

Referring to FIG. 8, a light emitting diode EE-5 according to an embodiment may be a bottom emission light emitting diode, and an insulating layer ISL-5 of the light emitting diode EE-5 may be disposed between the electron transport region ETR and the emission layer EML. The insulating layer ISL-5 may be disposed to make contact with the emission layer EML. The insulating layer ISL-5 may be disposed between the electron transport layer ETL and the emission layer EML, and the excessive injection of electrons from the electron transport layer ETL to the emission layer EML may be prevented or reduced. More particularly, according to the kind of the quantum dot QD included in the emission layer EML, electron injection properties may be higher than hole injection properties, but the amount of electrons and the amount of holes injected may be controlled to make (achieve) balance due to the insulating layer ISL-5 disposed between the electron transport layer ETL and the emission layer EML, and thus the light emitting properties of the light emitting diode EE-5 may be improved.

Figure 9:
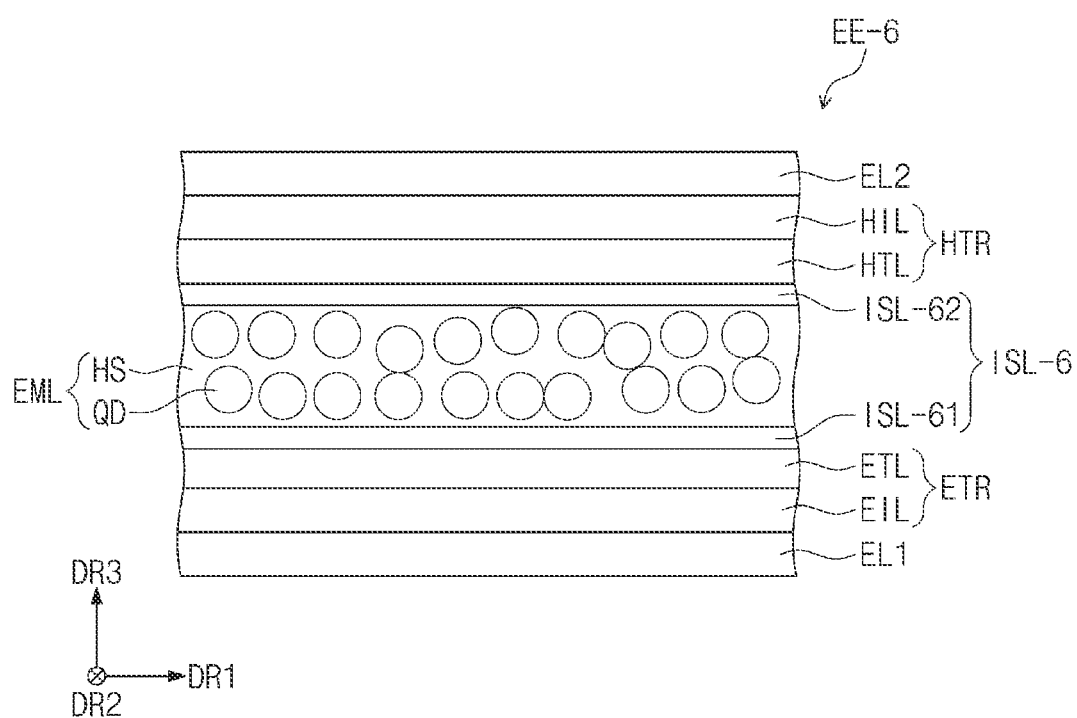

Referring to FIG. 9, an insulating layer ISL-6 in a light emitting diode EE-6 according to an embodiment may include a plurality of layers. The insulating layer ISL-6 may include a first insulating layer ISL-61 and a second insulating layer ISL-62. The first insulating layer ISL-61 may be disposed between an emission layer EML and an electron transport region ETR, and the second insulating layer ISL-62 may be disposed between the emission layer EML and a hole transport region HTR. The first insulating layer ISL-61 and the second insulating layer ISL-62 each may be disposed to make contact with the emission layer EML. The material included in and the thickness of the first insulating layer ISL-61 and the second insulating layer ISL-62 each may be appropriately (or suitably) selected according to the kind of the quantum dot QD included in the emission layer EML so as to make (achieve) suitable balance of hole injection properties and electron injection properties. For example, if the quantum dot QD included in the emission layer EML has hole injection properties higher than electron injection properties, the thickness of the second insulating layer ISL-62 may be greater than the thickness of the first insulating layer ISL-61.

Figure 10:
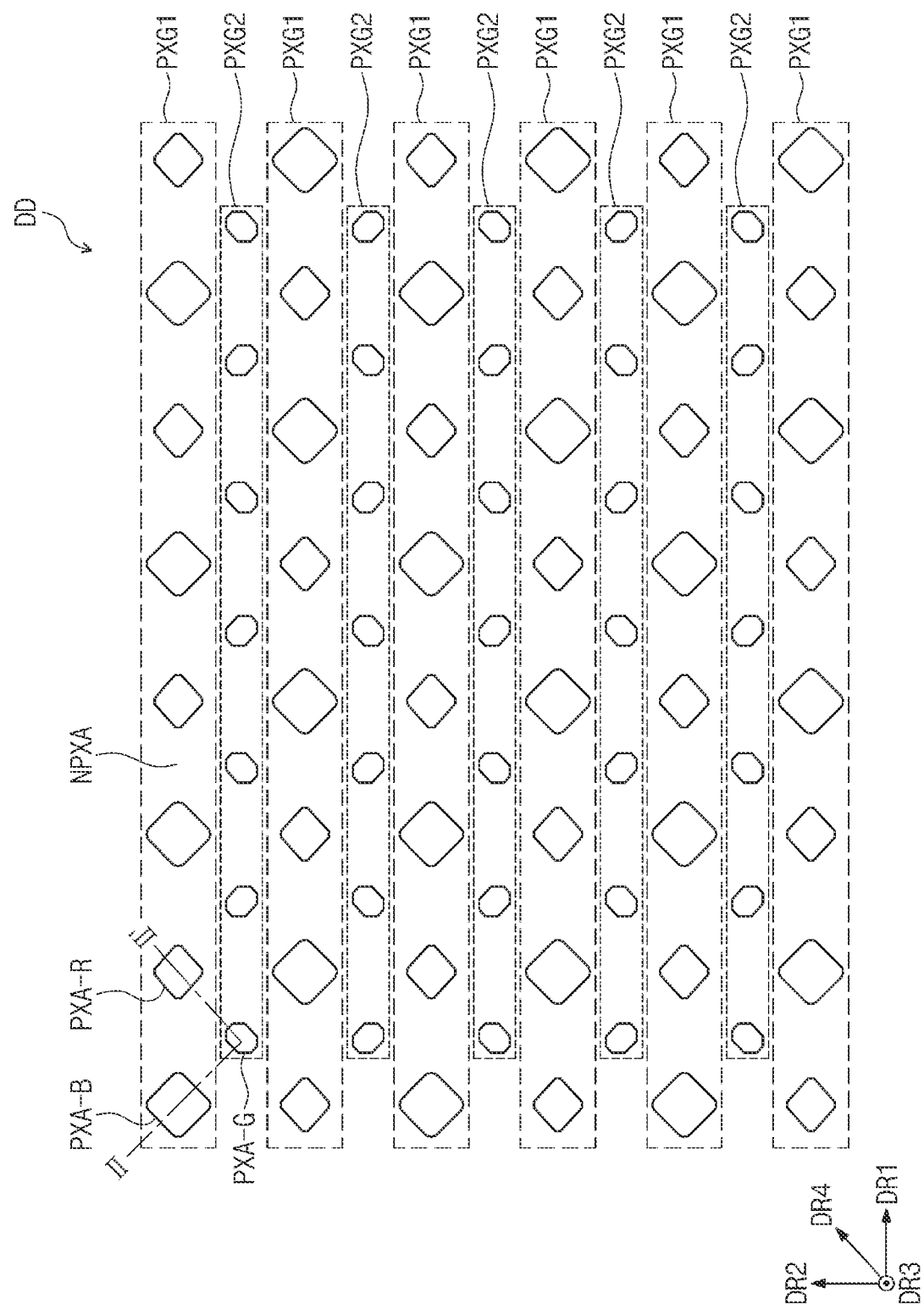
FIG. 10 is a plan view of a display device according to an embodiment of the inventive concept.
Figure 11:
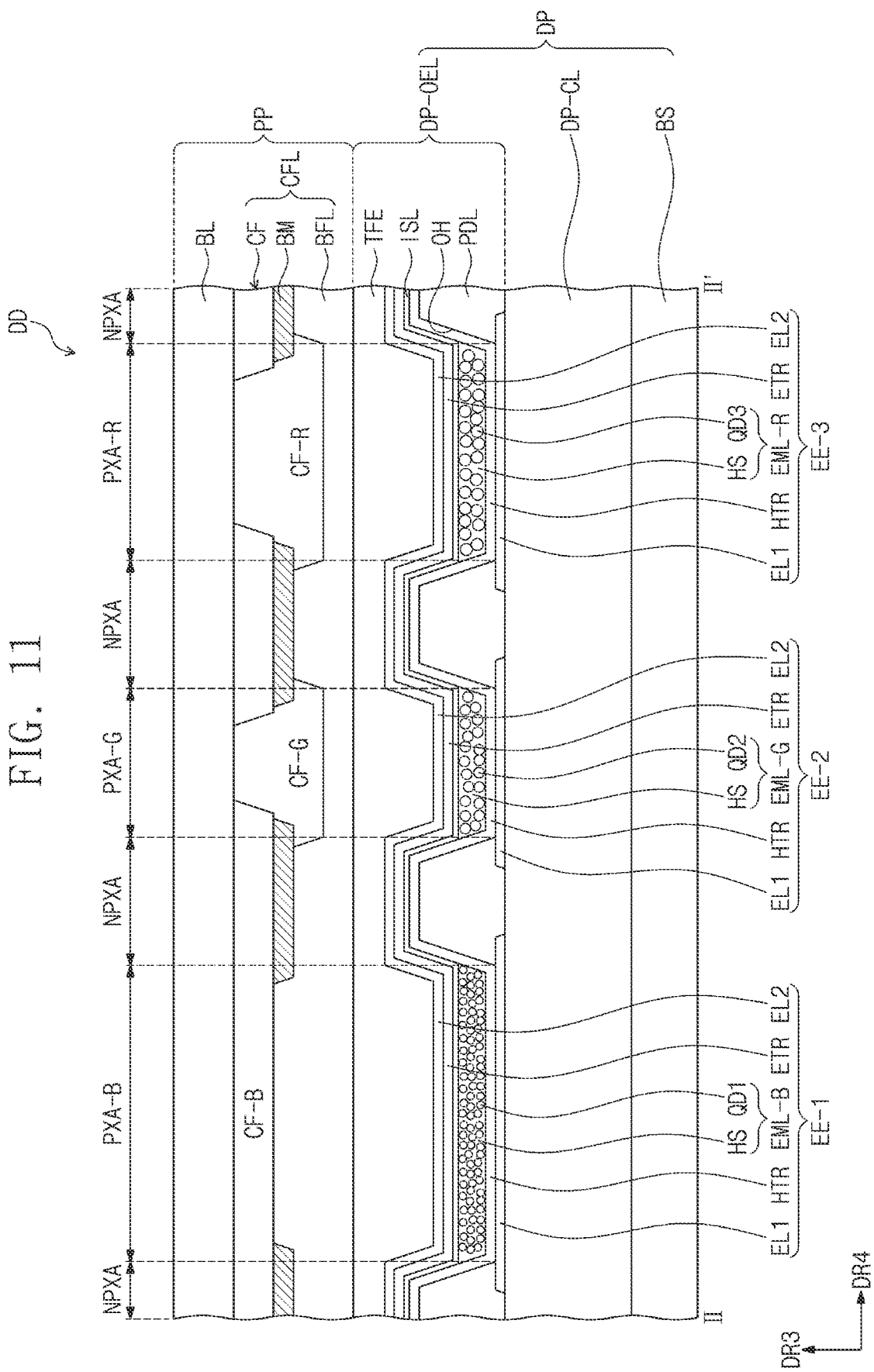
FIG. 11 and FIG. 12 are cross-sectional views of display devices according to embodiments of the inventive concept.

FIG. 10 is a plan view of a display device DD according to an embodiment of the inventive concept. FIG. 11 is a cross-sectional view of a display device DD according to an embodiment of the inventive concept. FIG. 11 is a cross-sectional view corresponding to line II-II' in FIG. 10.

The display device DD of an embodiment includes a plurality of light emitting diodes EE-1, EE-2 and EE-3, and the light emitting diodes EE-1, EE-2 and EE-3 may include emission layers EML-B, EML-G and EML-R, which include quantum dots QD1, QD2 and QD3, respectively.

In addition, the display device DD of an embodiment may include a display panel DP including the plurality of light emitting diodes EE-1, EE-2 and EE-3, and a light control layer PP disposed on the display panel DP. In some embodiments, however, the light control layer PP may be omitted from the display device DD.

The display panel DP may include a base substrate BS, a circuit layer DP-CL disposed on the base substrate BS, and a display device layer DP-OEL. The display device layer DP-OEL may include a pixel defining layer PDL, light emitting diodes EE-1, EE-2 and EE-3 separately disposed by the pixel defining layer PDL (e.g., the light emitting diodes EE-1, EE-2 and EE-3 may be spaced apart from each other with the pixel defining layer PDL therebetween), and an encapsulation layer TFE disposed on the light emitting diodes EE-1, EE-2 and EE-3.

The base substrate BS may be a member providing a base surface where the display device layer DP-OEL is disposed. The base substrate BS may be a glass substrate, a metal substrate, a plastic substrate, etc. However, embodiments of the inventive concept are not limited thereto, and the base substrate BS may include (e.g., may be) an inorganic layer, an organic layer, or a composite material layer.

In one or more embodiments, the circuit layer DP-CL may be disposed on the base substrate BS, and the circuit layer DP-CL may include a plurality of transistors. Each of the plurality of transistors may include a control electrode, an input electrode, and an output electrode. For example, the circuit layer DP-CL may include a switching transistor and a driving transistor for driving the light emitting diodes EE-1, EE-2 and EE-3 of the display device layer DP-OEL.

The light emitting diodes EE-1, EE-2 and EE-3 each may include a first electrode EL1, a hole transport region HTR, emission layers EML-B, EML-G and EML-R (respectively), an insulating layer ISL, an electron transport region ETR, and a second electrode EL2. The same explanation (description) of the light emitting diode EE of an embodiment provided herein may be applied for the light emitting diodes EE-1, EE-2 and EE-3. For example, on the emission layers EML-B, EML-G and EML-R of the light emitting diodes EE-1, EE-2 and EE-3, the insulating layer ISL may be disposed. FIG. 11 shows a case where the insulating layer ISL is disposed between the emission layers EML-B, EML-G and EML-R and the electron transport region ETR as an embodiment, but an embodiment of the inventive concept is not limited thereto. The insulating layer ISL may be disposed between the hole transport region HTR and the emission layers EML-B, EML-G and EML-R, respectively; or the insulating layer ISL may be disposed both between the electron transport region ETR and the emission layers EML-B, EML-G and EML-R, respectively, and between the hole transport region HTR and the emission layers EML-B, EML-G and EML-R, respectively.

The encapsulation layer TFE may cover the light emitting diodes EE-1, EE-2 and EE-3. The encapsulation layer TFE may be disposed directly on the second electrode EL2. The encapsulation layer TFE may be one (e.g., a single) layer or a laminated layer including a plurality of layers. The encapsulation layer TFE may be a thin film encapsulation layer. The encapsulation layer TFE protects the light emitting diodes EE-1, EE-2 and EE-3. The encapsulation layer TFE may cover the top surface of the second electrode EL2 disposed in an opening part OH, and may fill the opening part OH.

Referring to FIGS. 10 and 11, the display device DD may include a non-emission region NPXA and emission regions PXA-B, PXA-G and PXA-R. Each of the emission regions PXA-B, PXA-G and PXA-R may be a region emitting light produced from each of the light emitting diodes EE-1, EE-2 and EE-3. The light emitting regions PXA-B, PXA-G and PXA-R may be separated from each other on a plane (e.g., on a plane defined by the first and second directions DR1 and DR2).

The emission regions PXA-B, PXA-G and PXA-R may be divided into a plurality of groups according to the color of light produced in the light emitting diodes EE-1, EE-2 and EE-3. In the display device DD of an embodiment as shown in FIG. 10 and FIG. 11, three emission regions PXA-B, PXA-G and PXA-R emitting blue light, green light and red light, respectively, are shown as an embodiment. For example, the display device DD of an embodiment may include a blue emission region PXA-B, a green emission region PXA-G and a red emission region PXA-R, which are distinguished from each other.

A plurality of light emitting diodes EE-1, EE-2 and EE-3 may emit lights in different wavelength regions. For example, in one or more embodiments, the display device DD may include a first light emitting diode EE-1 emitting blue light, a second light emitting diode EE-2 emitting green light, and a third light emitting diode EE-3 emitting red light. However, an embodiment of the inventive concept is not limited thereto, and the first to third light emitting diodes EE-1, EE-2 and EE-3 may emit light in the same wavelength region or at least one thereof may emit light in a different wavelength region.

In one or more embodiments, the blue emission region PXA-B, the green emission region PXA-G, and the red emission region PXA-R of the display device DD may correspond to the first light emitting diode EE-1, the second light emitting diode EE-2, and the third light emitting diode EE-3, respectively.

The first emission layer EML-B of the first light emitting diode EE-1 may include a first quantum dot QD1. The first quantum dot QD1 may emit blue light, which is the first color light. The first light emitting diode EE-1 may include a first host.

The second emission layer EML-G of the second light emitting diode EE-2 and the third emission layer EML-R of the third light emitting diode EE-3 may include a second quantum dot QD2 and a third quantum dot QD3, respectively. The second quantum dot QD2 and the third quantum dot QD3 may emit green light, which is the second color light and red light, which is the third color light, respectively. The second light emitting diode EE-2 and the third light emitting diode EE-3 may include a second host and a third host, respectively.

In one or more embodiments shown in FIG. 11, the average diameters of the first to third quantum dots QD1, QD2 and QD3 may be different from each other. For example, the first quantum dot QD1 used in the first light emitting diode EE-1 which emits light in a relatively short wavelength region may have a relatively smaller average diameter when compared with the second quantum dot QD2 of the second light emitting diode EE-2 and the third quantum dot QD3 of the third light emitting diode EE-3, which emit light in relatively long wavelength regions.

The relation on the average diameters of the first to third quantum dots QD1, QD2 and QD3 is not limited to the above-defined particulars. That is, in the display device DD of an embodiment, shown in FIG. 11, the average diameters of the first to third quantum dots QD1, QD2 and QD3 are shown to be different from each other. However, in one or more embodiments, the average diameters of first to third quantum dots QD1, QD2 and QD3, which are included in the light emitting diodes EE-1, EE-2 and EE-3, may be similar. In some embodiments, the average diameters of two quantum dots selected among first to third quantum dots QD1, QD2 and QD3 may be similar and the remaining one may be different.

In one or more embodiments, the first to third quantum dots QD1, QD2 and QD3 included in the light emitting diodes EE-1, EE-2 and EE-3 may be formed using different core materials from each other. In one or more embodiments, the first to third quantum dots QD1, QD2 and QD3 may be formed using the same core material, or two selected among the first to third quantum dots QD1, QD2 and QD3 may be formed using the same core material and the remaining one may be formed using a different core material.

In the display device DD of an embodiment, as shown in FIG. 10 and FIG. 11, the areas of the emission regions PXA-B, PXA-G and PXA-R may be different from each other. In this case, the area of an emission region may be measured in a plane (e.g., in a plane defined by the first and second directions DR1 and DR2), to which the third direction DR3 is normal.

The emission regions PXA-B, PXA-G and PXA-R may have different areas according to the color emitted from the emission layers EML-B, EML-G and EML-R of the light emitting diodes EE-1, EE-2 and EE-3. For example, referring to FIG. 10 and FIG. 11, the blue emission region PXA-B corresponding to the first light emitting diode EE-1, which emits blue light, may have the largest area, and the green emission region PXA-G corresponding to the second light emitting diode EE-2, which generates green light, may have the smallest area in the display device DD of an embodiment. However, embodiments of the inventive concept are not limited thereto, and the emission regions PXA-B, PXA-G and PXA-R may emit light other than blue light, green light and red light, or the emission regions PXA-B, PXA-G and PXA-R may have the same area. In some embodiments, the emission regions PXA-B, PXA-G and PXA-R may be defined to have an area ratio different from that shown in FIG. 10.

Each of the emission regions PXA-B, PXA-G and PXA-R may be a region divided by a pixel defining layer PDL. The non-emission regions NPXA may be regions between neighboring emission regions PXA-B, PXA-G and PXA-R and may correspond to regions of the pixel defining layer PDL. Meanwhile, each of the emission regions PXA-B, PXA-G and PXA-R may correspond to a pixel in the present disclosure. The pixel defining layer PDL may divide (separate) the light emitting diodes EE-1, EE-2 and EE-3. The emission layers EML-B, EML-G and EML-R of the light emitting diodes EE-1, EE-2 and EE-3 may be divided in an opening part OH defined by the pixel defining layer PDL.

The pixel defining layer PDL may be formed using a polymer resin. For example, the pixel defining layer PDL may be formed by including a polyacrylate-based resin and/or a polyimide-based resin. In addition, the pixel defining layer PDL may be formed by further including an inorganic material, in addition to the polymer resin. The pixel defining layer PDL may be formed by including a light absorbing material and/or may be formed by including a black pigment and/or a black dye. The pixel defining layer PDL formed by including the black pigment and/or the black dye may embody a black pixel defining layer. In forming the pixel defining layer PDL, carbon black may be used as the black pigment and/or the black dye, but embodiments of the inventive concept are not limited thereto.

In one or more embodiments, the pixel defining layer PDL may be formed using an inorganic material. For example, the pixel defining layer PDL may be formed by including silicon nitride ($SiN_x$), silicon oxide ($SiO_x$), silicon oxynitride ($SiO_xN_y$), etc. The pixel defining layer PDL may define the emission regions PXA-B, PXA-G and PXA-R. By the pixel defining layer PDL, the emission regions PXA-B, PXA-G and PXA-R and the non-emission region NPXA may be divided (or arranged to be separate from each other).

Referring to FIG. 10, the blue emission regions PXA-B and the red emission regions PXA-R may be alternately arranged in the first direction DR1 to form a first group PXG1. The green emission regions PXA-G may be arranged in the first direction DR1 to form a second group PXG2.

The first group PXG1 and the second group PXG2 may be separately disposed in the second direction DR2. Each of the first group PXG1 and the second group PXG2 may be provided in plural. The first groups PXG1 and the second groups PXG2 may be alternately arranged in the second direction DR2.

One green emission region PXA-G may be separately disposed from one blue emission region PXA-B or one red emission region PXA-R in a fourth direction DR4. The fourth direction DR4 may be a direction (e.g., a diagonal) between the first direction DR1 and the second direction DR2.

The arrangement structure of the emission regions PXA-B, PXA-G and PXA-R shown in FIG. 10 may have a pantile structure. However, the arrangement structure of the emission regions PXA-B, PXA-G and PXA-R in the display device DD according to the present embodiments is not limited to the arrangement structure shown in FIG. 10. For example, in one or more embodiments, the emission regions PXA-B, PXA-G and PXA-R may have a stripe structure, wherein the blue emission region PXA-B, the green emission region PXA-G, and the red emission region PXA-R may be alternately arranged along the first direction DR1.

Referring to FIG. 2 and FIG. 11, the display device DD of an embodiment further includes a light control layer PP. In the display device DD, the light control layer PP may block or reduce external light incident to the display panel DP from the exterior of the display device DD. The light control layer PP may block or reduce a portion of the external light. The light control layer PP may have a reflection preventing function by which reflection of external light is minimized or reduced.

In one or more embodiments shown in FIG. 11, the light control layer PP may include a color filter layer CFL. In the display device DD of an embodiment, the light control layer PP may include a base layer BL and the color filter layer CFL.

The base layer BL may be a member providing a base surface where the color filter layer CFL, etc. is disposed. The base layer BL may be a glass substrate, a metal substrate, a plastic substrate, etc. However, embodiments of the inventive concept are not limited thereto, and the base layer BL may be an inorganic layer, an organic layer, or a composite material layer.

The color filter layer CFL may include a light blocking part BM and a color filter part CF. The color filter part CF may include a plurality of filters CF-B, CF-G and CF-R. That is, the color filter layer CFL may include a first filter CF-B which transmits the first color light, a second filter CF-G which transmits the second color light, and a third filter CF-R which transmits the third color light. For example, the first filter CF-B may be a blue filter, the second filter CF-G may be a green filter, and the third filter CF-R may be a red filter.

The filters CF-B, CF-G and CF-R each may include a polymer photosensitive resin and a pigment or dye. The first filter CF-B may include a blue pigment or dye, the second filter CF-G may include a green pigment or dye, and the third filter CF-R may include a red pigment or dye.

The filters CF-B, CF-G and CF-R each may include a light emitting body. The filters CF-B, CF-G and CF-R each may include a quantum dot. The quantum dots included in the first filter CF-B, the second filter CF-G and the third filter CF-R may be different from each other. The quantum dots included in the first filter CF-B, the second filter CF-G and the third filter CF-R may have different core materials and/or the average diameters of the included cores may be different from each other.

However, embodiments of the inventive concept are not limited thereto, and the first filter CF-B may not include a pigment, a dye or a light emitting body. For example, the first filter CF-B may include a polymer photosensitive resin, and not include a pigment, a dye and/or a light emitting body. The first filter CF-B may be transparent. The first filter CF-B may be formed using a transparent photosensitive resin.

The light blocking part BM may be a black matrix. The light blocking part BM may be formed by including an organic light blocking material and/or an inorganic light blocking material, including a black pigment and/or a black dye. The light blocking part BM may prevent or reduce light leakage phenomenon and divide boundaries between adjacent filters CF-B, CF-G and CF-R.

The color filter layer CFL may further include a buffer layer BFL. For example, the buffer layer BFL may be a protection layer protecting the filters CF-B, CF-G and CF-R. The buffer layer BFL may include an inorganic layer including at least one inorganic material selected from silicon nitride, silicon oxide, and silicon oxynitride. The buffer layer BFL may include an organic layer which may help planarize the bottom surface of the color filter layer CFL. The buffer layer BFL may include, for example, an organic layer including an acrylate-based organic material. The buffer layer BFL may be formed as a single layer or a plurality of layers.

In one or more embodiments shown in FIG. 11, the first color filter CF-B of the color filter layer CFL is shown to be overlapped with the second filter CF-G and the third filter CF-R, but embodiments of the inventive concept are not limited thereto. For example, the first to third filters CF-B, CF-G and CF-R may be divided by the light blocking part BM and non-overlapped with each other. In one or more embodiments, the first to third filters CF-B, CF-G and CF-R may be disposed to correspond to the blue emission region PXA-B, green emission region PXA-G, and red emission region PXA-R, respectively.

Figure 12:
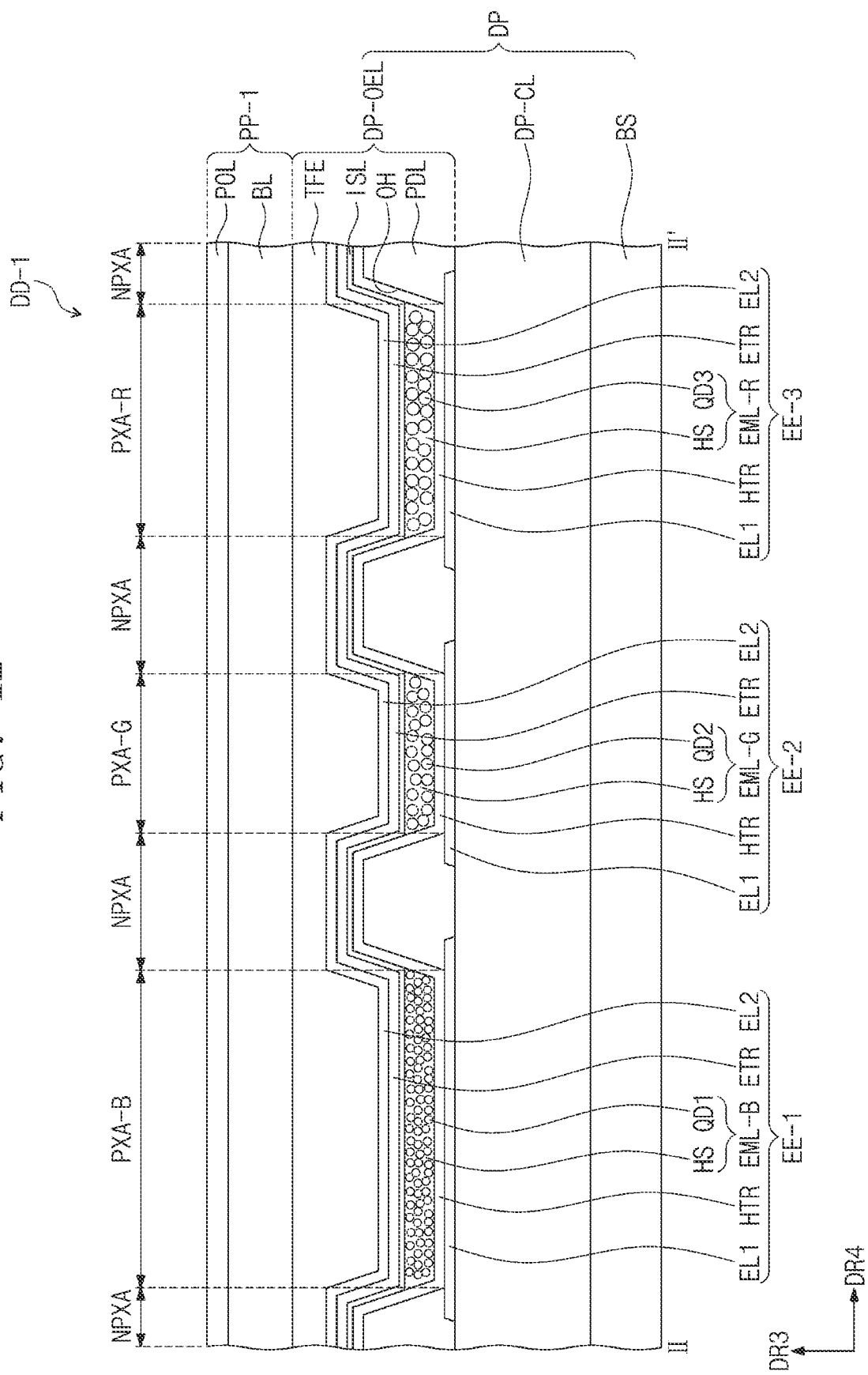

FIG. 12 is a cross-sectional view showing a display device DD-1 according to an embodiment of the inventive concept. In explaining the display device DD-1 according to an embodiment, as shown in FIG. 12, the same reference symbols are designated for the elements explained above referring to FIG. 11, and the above-provided descriptions will not be provided again.

The display device DD-1 according to an embodiment shown in FIG. 12 may include a display panel DP including a plurality of light emitting diodes EE-1, EE-2 and EE-3, and a light control layer PP-1. The same explanation as that provided in connection with FIG. 11 above may be applied to the display panel DP and the light emitting diodes EE-1, EE-2 and EE-3, included in the display device DD-1 of FIG. 12.

The display device DD-1 of an embodiment, as shown in FIG. 12, is different from the display device DD shown in FIG. 11 with respect to the light control layer. The light control layer PP-1 included in the display device DD-1 of an embodiment, as shown in FIG. 12, may include a polarization layer POL.

In one or more embodiments, the light control layer PP-1 may include a polarization layer POL and a base layer BL supporting the polarization layer POL.

The base layer BL may be a member providing a base surface where the polarization layer POL is disposed. The base layer BL may be a glass substrate, a metal substrate, a plastic substrate, etc. However, embodiments of the inventive concept are not limited thereto, and the base layer BL may be an inorganic layer, an organic layer, or a composite material layer.

The polarization layer POL may block or reduce external light incident on the display panel DP. For example, the polarization layer POL may block or reduce a portion of the external light.

In addition, the polarization layer POL may decrease reflected external light at the display panel DP. For example, in embodiments where incident light from exterior of the display device DD is incident to the display panel DP and then reflected, the polarization layer POL may carry out a blocking function of (e.g., may block or reduce) the reflected light. The polarization layer POL may be a circular polarizer having reflection preventing (or reducing) function and/or the polarization layer POL may include a $\lambda/4$ phase retarder from a linear polarizer.

In FIG. 12, the polarization layer POL is shown to be disposed on the base layer BL and exposed, but embodiments of the inventive concept are not limited thereto. For example, the polarization layer POL may be disposed under the base layer BL.

The display device of one or more of the present embodiments may include an insulating layer above and/or under the emission layer which includes a quantum dot, and the insulating layer may keep (achieve and/or maintain) balance between the hole injection properties and the electron injection properties of a material for the emission layer. Accordingly, the display device may show improved life characteristics and emission efficiency properties.

Hereinafter, the method for manufacturing a light emitting diode according to one or more embodiments of the inventive concept will be explained referring to drawings.

Figure 13:
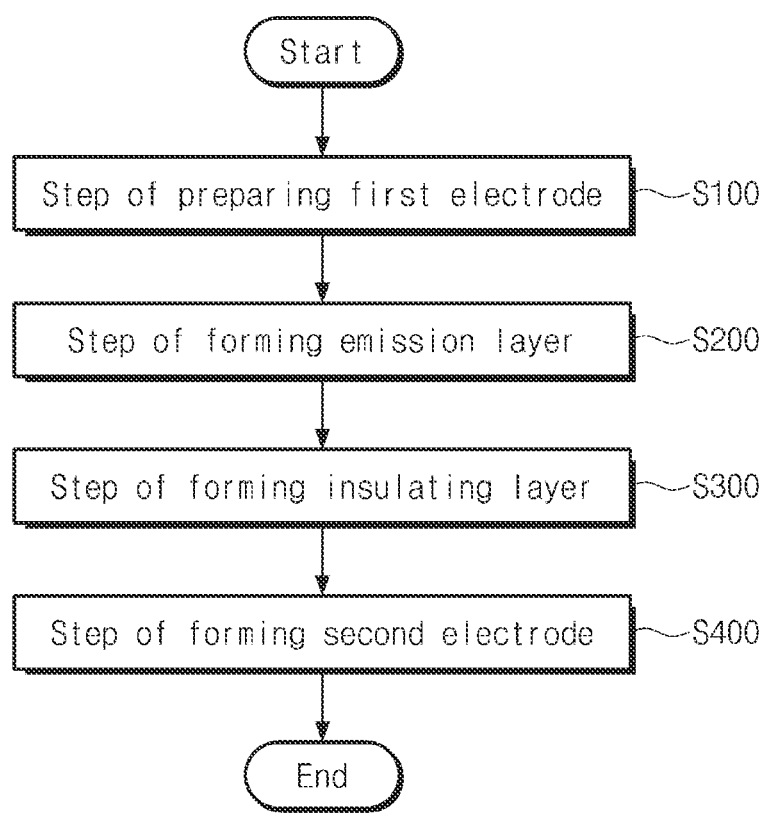
FIG. 13 is a flowchart showing a method for manufacturing a light emitting diode according to an embodiment of the inventive concept.

FIG. 13 is a flowchart of a method for manufacturing a light emitting diode according to an embodiment of the inventive concept. FIG. 14A to FIG. 14E are cross-sectional views showing acts of a method for manufacturing a light emitting diode one according to an embodiment of the inventive concept in order.

Referring to FIG. 13, the method for manufacturing a light emitting diode according to an embodiment of the inventive concept includes a step (act) of preparing a first electrode (S100), a step (act) of forming an emission layer on the first electrode (S200), a step (act) of forming an insulating layer on the emission layer (S300), and a step (act) of forming a second electrode on the insulating layer (S400).

Figure 14A:
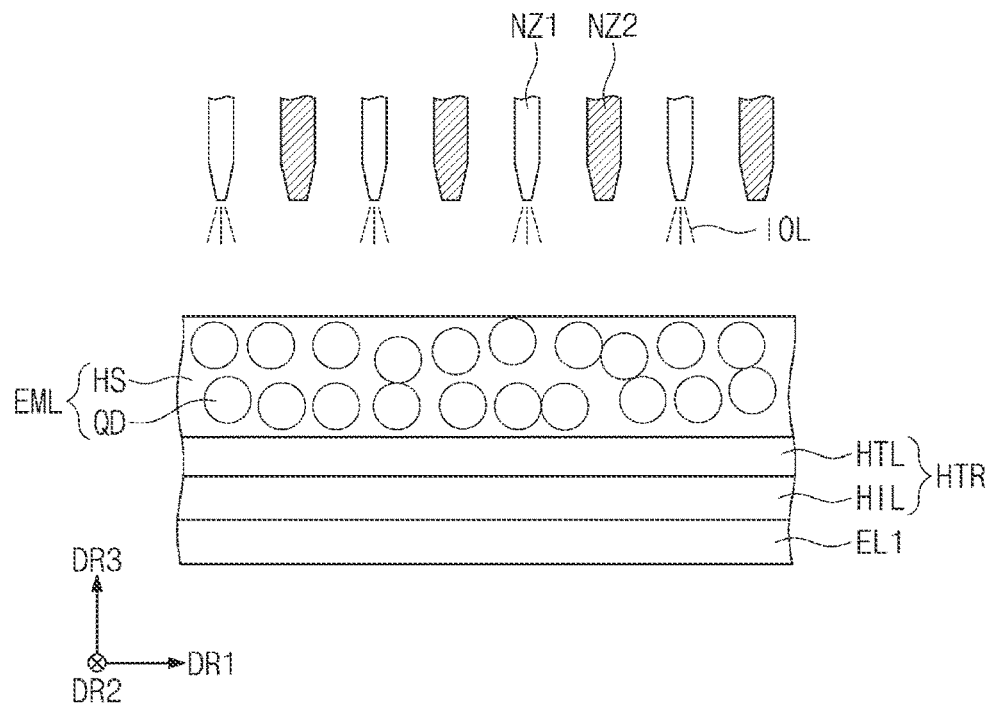
FIGS. 14A-14E are cross-sectional views showing acts of a method for manufacturing a light emitting diode according to an embodiment of the inventive concept in order.

Referring to FIG. 13 and FIG. 14A, the method for manufacturing a light emitting diode according to an embodiment of the inventive concept includes a step of forming an emission layer EML on the first electrode EL1 (S200), after the step of preparing the first electrode EL1. In the method for manufacturing the light emitting diode according to one or more embodiments, a step of forming a plurality of organic layers may be further included prior to the step of forming the emission layer EML. In one or more embodiments, prior to forming the emission layer EML, and after forming a hole injection layer HIL and a hole transport layer HTL in order, the emission layer EML may be formed on the hole transport layer HTL. The hole injection layer HIL, the hole transport layer HTL, and the emission layer EML may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

The emission layer EML includes a quantum dot QD. The emission layer EML may be formed by dispersing a plurality of quantum dots QD in a material for the base part HS, and then, applying and drying thereof.

Figure 14B:
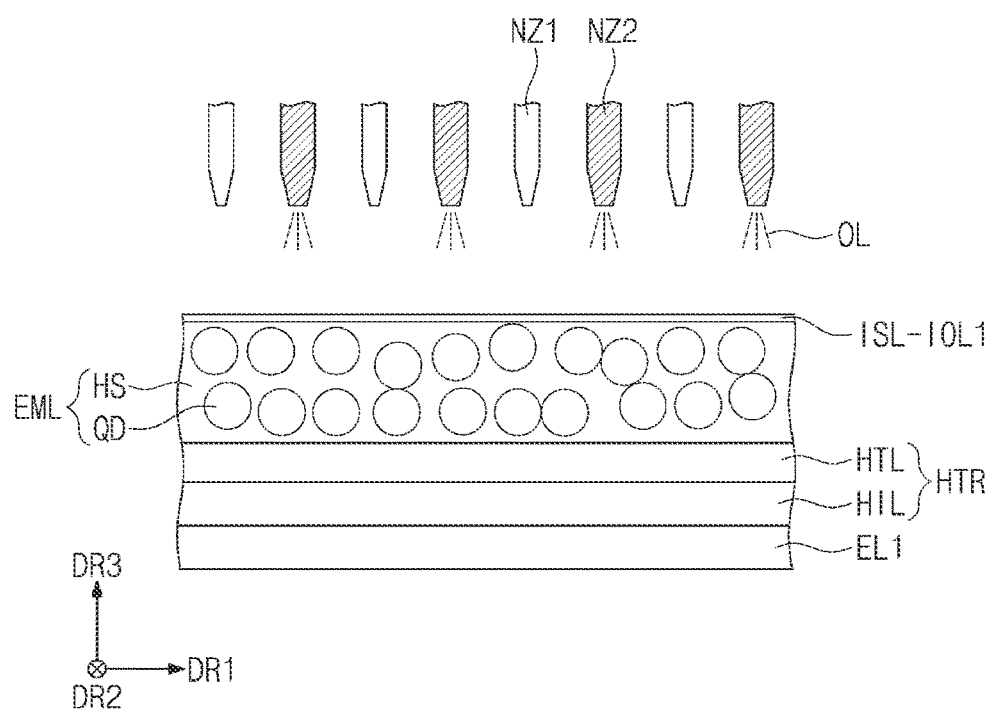

Referring to FIG. 13, FIG. 14A and FIG. 14B together, an inorganic material IOL is deposited on the emission layer EML to form an inorganic insulating layer ISL-IOL1. The inorganic insulating layer ISL-IOL1 may be formed by depositing an inorganic material IOL through an atomic layer deposition (ALD) method. The inorganic material IOL may include at least one selected from $SiN_x$, $SiO_x$, $Al_2O_3$, $TiO_x$ and $ZrO_x$.

Figure 14C:
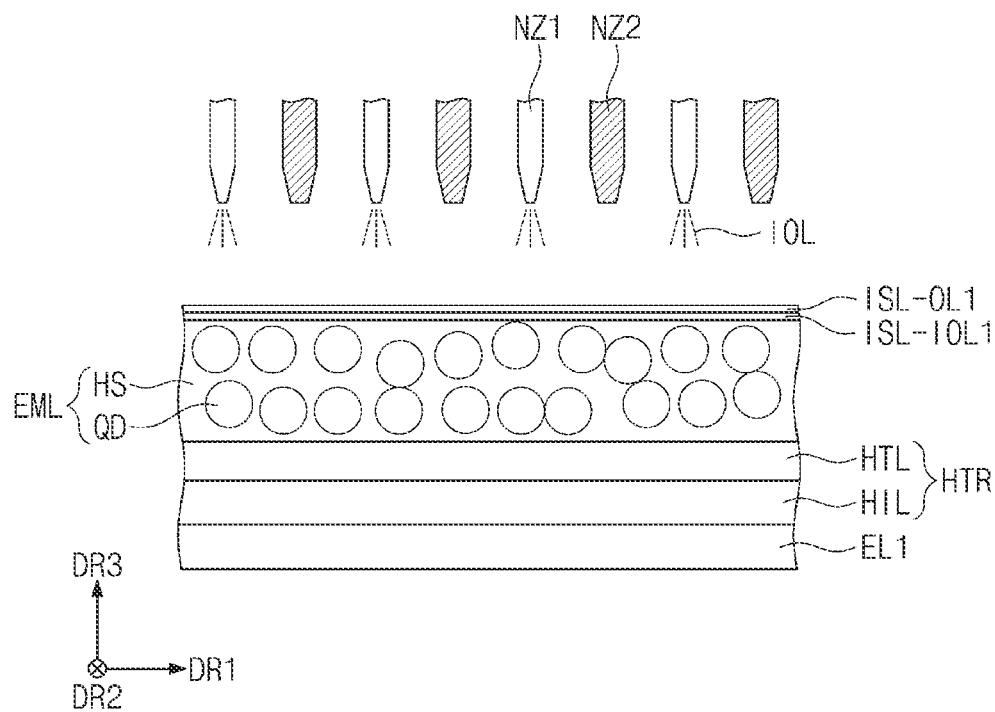

Referring to FIG. 13, FIG. 14B and FIG. 14C together, an organic material OL is deposited on the inorganic insulating layer ISL-IOL1 to form an organic insulating layer ISL-OL1. The organic insulating layer ISL-OL1 may be formed by depositing the organic material OL through a chemical vapor deposition (CVD) method. The organic material OL may include at least one selected from n-hexane, furan and hexamethyldisiloxane.

Figure 14D:
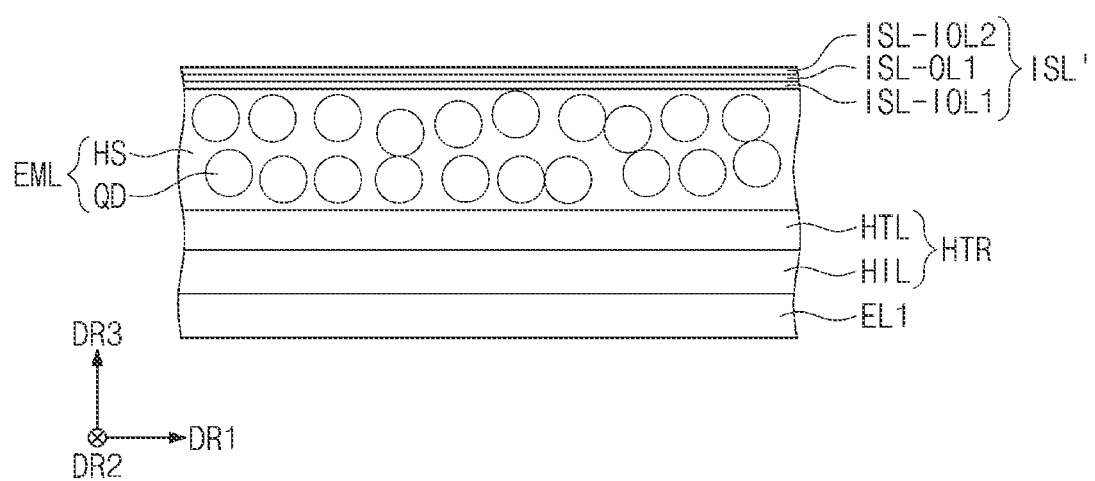

Referring to FIG. 13, FIG. 14C and FIG. 14D together, after forming the organic insulating layer ISL-OL1, the inorganic material IOL may be deposited again to form a second inorganic insulating layer ISL-IOL2. The second inorganic insulating layer ISL-IOL2 may be formed by depositing the inorganic material IOL through an atomic layer deposition (ALD) method.

As shown in FIG. 14A to FIG. 14D, the method for manufacturing a light emitting diode according to one or more embodiments of the inventive concept includes a step of forming an insulating layer ISL' by depositing the inorganic material IOL on the emission layer EML. The step of forming the insulating layer ISL' may include a step of forming the inorganic insulating layers ISL-IOL1 and ISL-IOL2 by depositing the inorganic material IOL, and a step of forming the organic insulating layer ISL-OL1 by depositing the organic material OL. The step of forming the inorganic insulating layers ISL-IOL1 and ISL-IOL2 by depositing the inorganic material IOL, and the step of forming the organic insulating layer ISL-OL1 by depositing the organic material OL, may be performed alternately and in plural. In FIG. 14A to FIG. 14D, a case where the step of forming the inorganic insulating layers ISL-IOL1 and ISL-IOL2 is performed twice, and the step of forming the organic insulating layer ISL-OL1 is performed once is shown as an illustration, but embodiments of the inventive concept are not limited thereto, and the step of forming the inorganic insulating layers ISL-IOL1 and ISL-IOL2 and the step of forming the organic insulating layer ISL-OL1 may be performed twice or more, respectively.

In the method for manufacturing the light emitting diode according to one or more embodiments of the inventive concept, a first nozzle NZ1 spraying the inorganic material IOL and a second nozzle NZ2 spraying the organic material OL may be included in the same chamber, and a process of spraying the inorganic material IOL and a process of spraying the organic material OL may be alternately performed in the same chamber. In one or more embodiments, the first nozzle NZ1 spraying the inorganic material IOL and the second nozzle NZ2 spraying the organic material OL may be adjacently disposed in the same chamber, and the inorganic material IOL and the organic material OL may be alternately sprayed while a stage on which the light emitting diode is seated is reciprocally moving in a deposition step, to form the inorganic insulating layers ISL-IOL1 and ISL-IOL2, and the organic insulating layer ISL-OL1, alternately.

Figure 14E:
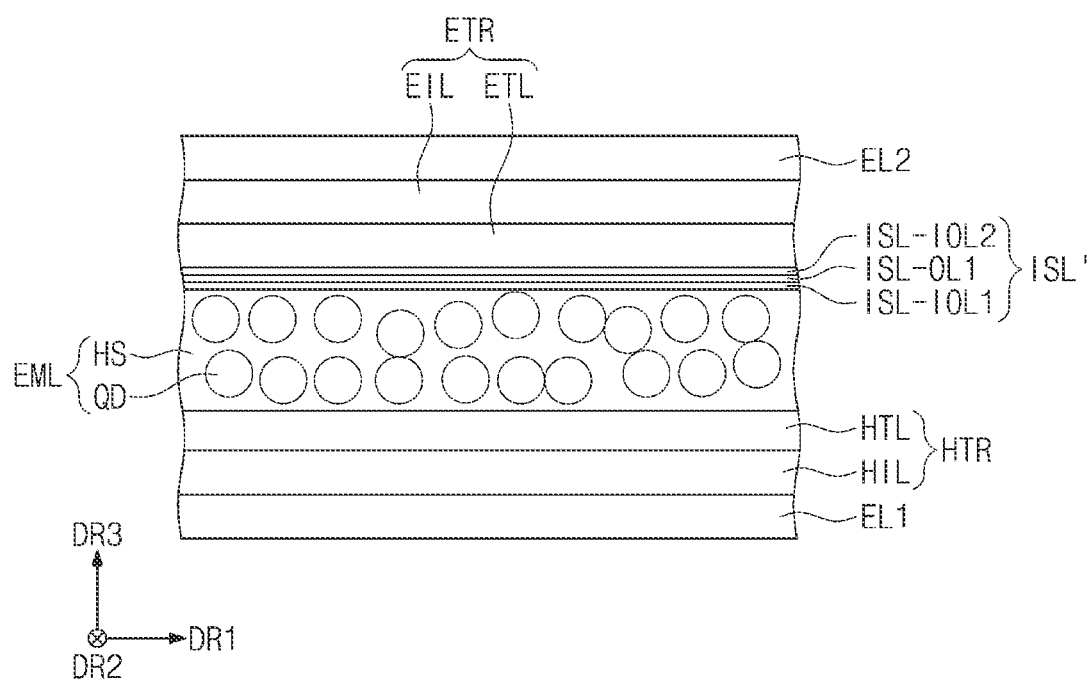

Referring to FIG. 13 and FIG. 14E, the method for manufacturing the light emitting diode according to an embodiment of the inventive concept includes a step of forming a second electrode EL2 on the insulating layer ISL'. In the method for manufacturing the light emitting diode according to an embodiment, a step of forming a plurality of organic layers may be further included prior to the step of forming the second electrode EL2. In one or more embodiments, prior to forming the second electrode EL2 and after forming an electron transport layer ETL and an electron injection layer EIL in order, the second electrode EL2 may be formed on the electron injection layer EIL. The electron transport layer ETL and the electron injection layer EIL may each independently be formed using one or more suitable methods such as a vacuum deposition method, a spin coating method, a cast method, a Langmuir-Blodgett (LB method), an inkjet printing method, a laser printing method, and/or a laser induced thermal imaging (LITI).

According to one or more embodiments of the inventive concept, an insulating layer is included adjacent to an emission layer which includes a quantum dot, and the charge balance of the emission layer may be improved, and through this, the life and emission efficiency of a light emitting diode and a display device including the same may be improved.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although example embodiments of the inventive concept have been described, it is understood that various changes and modifications can be made by one ordinary skilled in the art within the spirit and technical scope of the inventive concept described in the appended claims and their equivalents.

Accordingly, the technical scope of the inventive concept is to be determined by the following claims and their equivalents and shall not be restricted or limited by the foregoing detailed description.

What is claimed is:

1. A light emitting diode, comprising:
a first electrode;
a second electrode opposite the first electrode;
an emission layer between the first electrode and the second electrode, the emission layer comprising a quantum dot;
a first charge transfer layer between the first electrode and the emission layer;
a second charge transfer layer between the second electrode and the emission layer; and
a first layer between the first charge transfer layer and the emission layer, and/or between the second charge transfer layer and the emission layer,
wherein the first layer comprises an inorganic material, and
wherein the second charge transfer layer comprises:
an electron injection layer adjacent to the second electrode; and
an electron transport layer between the electron injection layer and the emission layer.

2. The light emitting diode of claim 1, wherein the first layer comprises at least one selected from $SiN_x$, $SiO_x$, $Al_2O_3$, $TiO_x$ and $ZrO_x$.

3. The light emitting diode of claim 1, wherein the first layer comprises:
at least one first inorganic layer comprising the inorganic material; and
at least one first organic layer comprising an organic material.

4. The light emitting diode of claim 3, wherein the at least one first inorganic layer comprises a first-1 inorganic layer and a first-2 inorganic layer, and
wherein the at least one first organic layer comprises a first-1 organic layer between the first-1 inorganic layer and the first-2 inorganic layer.

5. The light emitting diode of claim 3, wherein the at least one first organic layer comprises at least one selected from n-hexane, furan and hexamethyldisiloxane.

6. The light emitting diode of claim 1, wherein the first charge transfer layer comprises:
a hole injection layer adjacent to the first electrode; and
a hole transport layer between the hole injection layer and the emission layer.

7. The light emitting diode of claim 1, wherein the quantum dot comprises a cadmium-based material.

8. The light emitting diode of claim 1, wherein the first layer is between the electron transport layer and the emission layer.

9. The light emitting diode of claim 1, wherein the first layer comprises:
a first-1 layer between the first charge transfer layer and the emission layer; and
a first-2 layer between the second charge transfer layer and the emission layer.

10. The light emitting diode of claim 9, wherein the first-1 layer and the first-2 layer have different thicknesses.

11. The light emitting diode of claim 9, wherein at least one of the first-1 layer and the first-2 layer contacts the emission layer.

12. The light emitting diode of claim 1, wherein the emission layer comprises a plurality of quantum dots, and a base part in which the plurality of quantum dots is dispersed.

13. The light emitting diode of claim 1, wherein a thickness of the first layer is from about 0.1 nm to about 10 nm.

14. A display device comprising a plurality of light emitting diodes, wherein each light emitting diode of the plurality of light emitting diodes comprises:
a first electrode;
a second electrode opposite the first electrode;
an emission layer between the first electrode and the second electrode, the emission layer comprising a quantum dot;
a first charge transfer layer between the first electrode and the emission layer;
a second charge transfer layer between the second electrode and the emission layer; and
a first layer between the first charge transfer layer and the emission layer, and/or between the second charge transfer layer and the emission layer,
wherein the first layer comprises an inorganic material, and
wherein the second charge transfer layer comprises:
an electron injection layer adjacent to the second electrode; and
an electron transport layer between the electron injection layer and the emission layer.

15. The display device of claim 14, wherein the plurality of light emitting diodes comprises:
a first light emitting diode comprising a first quantum dot to emit a first color light;
a second light emitting diode comprising a second quantum dot to emit a second color light, the second color light having a longer wavelength than that of the first color light; and
a third light emitting diode comprising a third quantum dot to emit a third color light, the third color light having a longer wavelength than that of the second color light.

16. The display device of claim 15, further comprising a light control layer on the plurality of light emitting diodes.

17. A method for manufacturing a light emitting diode, the method comprising:
- forming an emission layer comprising a quantum dot on a first electrode;
- forming a first layer by depositing an inorganic material on the emission layer;
- forming a second electrode on the first layer;
- forming a first charge transfer layer between the first electrode and the emission layer; and
- forming a second charge transfer layer between the second electrode and the emission layer,
- wherein the first layer is between the first charge transfer layer and the emission layer, and/or between the second charge transfer layer and the emission layer, and
- wherein the second charge transfer layer comprises:
- an electron injection layer adjacent to the second electrode; and
- an electron transport layer between the electron injection layer and the emission layer.

18. The method for manufacturing the light emitting diode of claim 17, wherein the forming of the first layer comprises:
- depositing the inorganic material through atomic layer deposition (ALD).

19. The method for manufacturing the light emitting diode of claim 17, wherein the forming of the first layer comprises:
- forming an inorganic insulating layer by depositing the inorganic material; and
- forming an organic insulating layer by depositing an organic material,
- wherein the forming of the inorganic insulating layer and the forming of the organic insulating layer are performed alternately and in plural.

20. The method for manufacturing the light emitting diode of claim 19, wherein the forming of the organic insulating layer comprises:
- depositing the organic material through chemical vapor deposition (CVD).

* * * * *